US012316442B2

(12) United States Patent
Kasichainula

(10) Patent No.: US 12,316,442 B2
(45) Date of Patent: May 27, 2025

(54) SYNCHRONIZING A REAL-TIME CLOCK AND A NETWORK CLOCK

(71) Applicant: Intel Corporation, Santa Clara, CA (US)

(72) Inventor: Kishore Kasichainula, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 644 days.

(21) Appl. No.: 17/559,737

(22) Filed: Dec. 22, 2021

(65) Prior Publication Data

US 2022/0116132 A1 Apr. 14, 2022

(51) Int. Cl.
*H04J 3/06* (2006.01)
*H04L 7/04* (2006.01)

(52) U.S. Cl.
CPC ............ *H04J 3/0667* (2013.01); *H04L 7/048* (2013.01)

(58) Field of Classification Search
CPC ............................. H04J 3/0667; H04L 7/048
See application file for complete search history.

(56) References Cited

U.S. PATENT DOCUMENTS

| 10,122,484 | B1* | 11/2018 | Kasichainula | ........ H04J 3/0697 |
| 2019/0020465 | A1* | 1/2019 | Carlstedt | ............... H04L 43/106 |
| 2019/0045475 | A1 | 2/2019 | Kasichainula | |
| 2021/0117418 | A1* | 4/2021 | Dadwal | ............... G06F 16/2465 |

FOREIGN PATENT DOCUMENTS

| NL | 2033555 | 1/2024 |
| WO | 2013163793 | 11/2013 |

OTHER PUBLICATIONS

"Netherlands Application Serial No. 2033555, Office Action mailed Nov. 29, 2022", With English machine translation, 5 pgs.
"Netherlands Application Serial No. 2033555, Search Report mailed Oct. 18, 2023", With English claims, 12 pgs.
Coleman, James, "Emerging COTS architecture support for real-time TSN ethernet", Applied Computing, ACM. pp. 258-265, (Apr. 8, 2019), 8 pages.

* cited by examiner

*Primary Examiner* — Brenda H Pham
(74) *Attorney, Agent, or Firm* — Schwegman Lundberg & Woessner, P.A.

(57) ABSTRACT

System and techniques for synchronizing a real-time clock and a network clock are described herein. A network device maintains an always running time (ART) replica of an ART in a compute system. The network device samples network time updates (e.g., precision time protocol messages) and the ART replica to produce error correction of the ART replica to the network time. The error correction is written to memory of the compute device to enable high precision synchronization between clock sources local to the compute device and the network time.

24 Claims, 11 Drawing Sheets

SYNCHRONIZING A REAL-TIME CLOCK AND A NETWORK CLOCK

TECHNICAL FIELD

Embodiments described herein generally relate to compute device clock synchronization and more specifically to synchronizing a real-time clock and a network clock.

BACKGROUND

Most compute devices today are designed as synchronous circuits. In this design, an oscillator, called a clock, generates a sequence of repetitive pulses, called the clock signal, that are distributed to the elements of a compute device, synchronizing time steps of operation between these elements. Synchronous logic enables simpler circuit designs to address valid result and race condition issues that may arise across the many devices of modern compute devices. Here, each device (e.g., gate) performs within a time frame (e.g., propagation delay). The interval between clock pulses is long enough to provide devices time to respond to the input changes and also for outputs from these devices to stabilize (e.g., settle) before the next clock pulse occurs. As long as devices are able to accept the inputs and stabilize outputs between the clock pulses, the circuit is guaranteed to be stable and reliable. An asynchronous design (e.g., no common clock signal) adds design complexity to detect when outputs are stable and also to address possible race conditions between devices.

Compute devices typically include one such clock locally. Such a clock may be called the always running time (ART). Output from the ART may be and a central processing unit (CPU) clock (e.g., time stamp counter (TSC)) have a known relationship, which may in turn be used to determine a system clock for the compute device. Generally, the system clock is a function of the operating system based on the TSC. In compute systems with a network interface (e.g., network interface controller (NIC)) and a network time source providing a network time (e.g., precision time protocol (PTP), network time protocol (NTP), etc.), the system time may synchronize with the network time, effectively establishing the network time as the system time.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
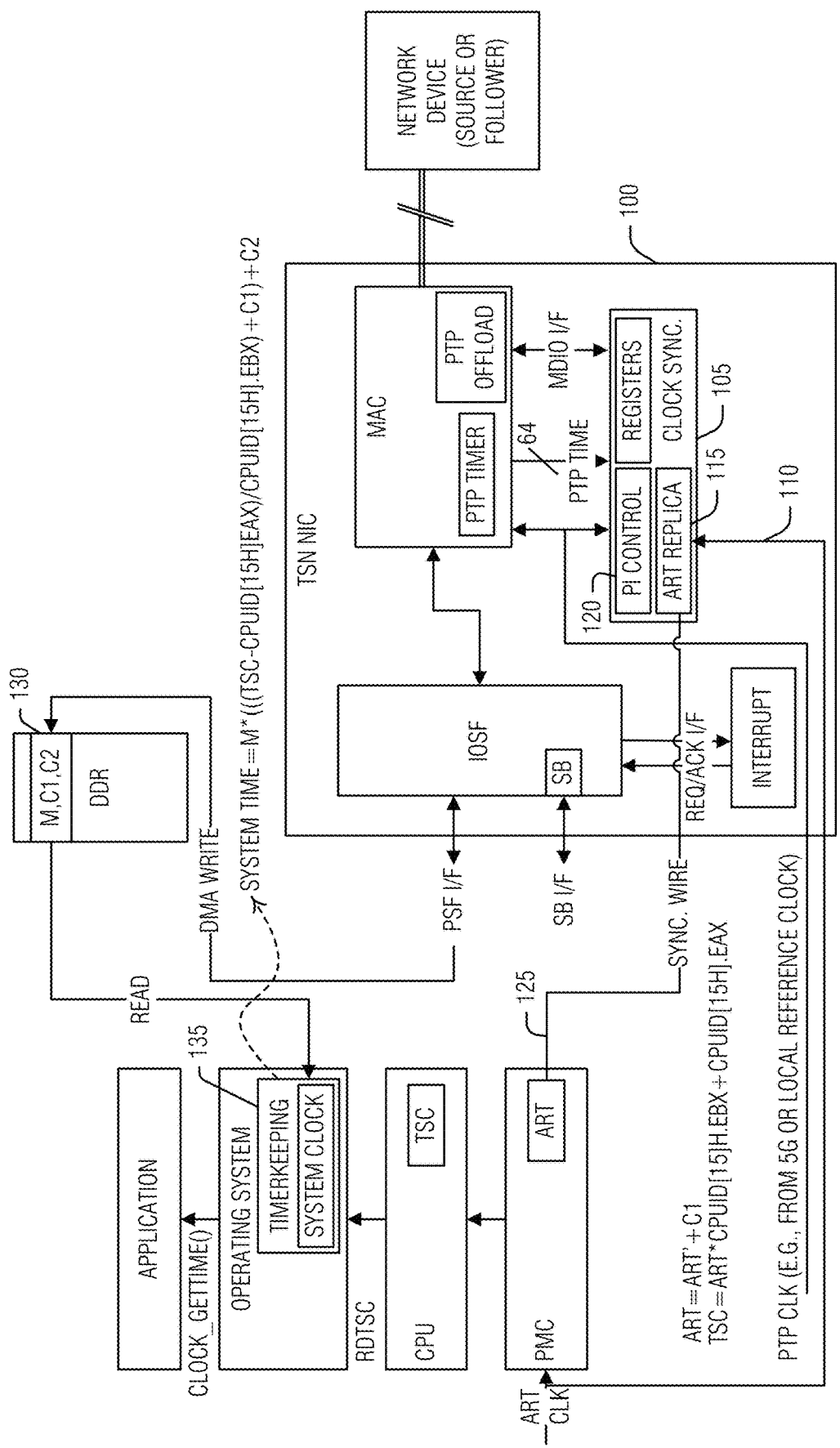
FIG. 1 is a block diagram of an example of an environment including a system for synchronizing a real-time clock and a network clock, according to an embodiment.

Emerging standards (e.g., IEEE standards) for deterministic networking—referred to collectively as Time Sensitive Networking (TSN)—provide extremely precise clock synchronization across the network. As a result, embedded designs in the industrial and automotive spaces are increasingly integrating network interface controllers (NICs), such as Ethernet controllers, with TSN features. The ability for applications to take advantage of the high precision clock synchronization afforded by TSN is ultimately limited by the precision, or lack thereof, between the local clock (e.g., software CPU Time Stamp Counter (TSC) obtained via the RDTSC instruction) and the network clock (e.g., IEEE 802.1AS-2011 or IEEE 1588-2008).

There are three primary factors that limit local and network synchronization accuracy. First, how the local timestamp clock and the NIC clock are sampled simultaneously. Second, the frequency of clock sampling and error is computed (e.g., corrected). Third, how stable the clock sources are with respect to each other. Generally, enabling simultaneous sampling at higher frequencies increases synchronization precision even when the underlying clocks are unstable (e.g., drift) with respect to each other.

Clock synchronization may be handled entirely in software, in hardware, or in a combination of both. For example, a software-based technique involves simultaneous cross timestamping and error correction are done in an operating system. In an example, the simultaneous cross timestamping may be carried out in the hardware, with the error correction computed in software. Generally, the software techniques limit the synchronization precision (e.g., accuracy) because of limited sampling rates. Generally, the power management component (PMC) ART and NIC timestamps are read (e.g., via memory-mapped input-output (MMIO) reads) by the software. Hence, the synchronization accuracy is limited due to latency differences in the simultaneous reading of these timestamps.

A hardware technique, called "hammock harbor," offers superior cross timestamping accuracy over pure software based cross timestamping. This hardware synchronization technique uses a proprietary on-chip system fabric (IOSF) sideband infrastructure to simultaneously sample the PMC ART clock and the network clock within about 100 nanoseconds (ns) of each other (e.g., resulting in a maximum error of two high speed clocks). Though in Hammock harbor, the timestamps of the ART clock and the NIC PTP are simultaneously captured with great accuracy, error correction is still done by operating system "timekeeping" software. The ART and PTP timestamps are repeatedly sampled, typically eight times in a second, correlated and an offset is computed. Then, a correction is applied to the local clock maintained by the software. This organization may lead to the offset correction accuracy being limited by the cross-timestamping frequency. This occurs because, between two samples, the clocks may be drifting. The worst case, the clocks are drifting in a direction opposite than the predicted direction. This may lead to a large synchronization error. Error correction between samples using interpolation may help reduce the synchronization error but is generally effective only when the clock drift matches with predicted drift, which is based on previous samples. However, the drift rate may change over time.

Even using a hardware sampling technique, synchronization error associated with transport delay of cross timestamping may occur when ART and NIC timers are physically far from one another. In general, the more complex a given system, the greater the likelihood that these elements are physically disparate. In large SoC die or multi-die SoC architectures, the problem may be significant.

Another issue that may arise involves the support of the correction software across operating systems. If different operating systems are in use, the availability of the software utility to compute and apply the correction may be a concern, possibly involving extra development to produce a version of the utility for every operating system used.

An issue that arises with any software assisted synchronization involves the use of the CPU to perform the task. Thus, the clock correction steals CPU cycles, sometimes using an entire core. Here, core isolation may be needed to avoid interference with other real-time tasks.

To address the issues noted above, the NIC is modified to include an ART replica and a time correction circuitry. This arrangement achieves extremely high clock synchronization accuracy by bringing the ART clock into the NIC and by performing cross-timestamping and within the NIC itself. This provides low-latency sampling and correction without the need for specialized side-band architectures. Accordingly, precise and simultaneous cross-timestamping of ART and PTP clocks and error correction at much higher frequencies—typically in several tens of megahertz (MHz) rather than at current eight Hertz (Hz)—are achieved.

The technique described herein significantly improves the clock synchronization accuracy over existing techniques by precisely cross timestamping the ART and PTP clocks simultaneously and by dynamically correcting the synchronization error in real-time at much higher rate than the existing methods. Not only is better accuracy provided, but the described techniques are scalable to different (e.g., non-IOSF) architectures and different operating systems. Further, there is no need for dedicated CPU core because the synchronization task (e.g., sampling and error correction computation) are offloaded to the NIC hardware. Additionally, die area and power are saved, resulting in more efficient implementations.

Containing the synchronization within the NIC hardware and may achieve accuracy of less than two PTP clock cycles (less than or equal to eight ns in a 250 MHz PTP clock), including simultaneous cross timestamping and error correction. Cross timestamping and the error correction happening on every sampling clock leads to better accuracy and quicker convergence between the two clock sources. Transport delay sources of error are also largely eliminated compared to arrangements in which the ART and the NIC timers are physically far apart on the same die or in multi-die SoCs. Additional details and examples are provided below.

FIG. 1 is a block diagram of an example of an environment including a system for synchronizing a real-time clock and a network clock, according to an embodiment. The TSN NIC 100 includes clock synchronization circuitry 105. The clock synchronization circuitry 105 includes an ART replica 115 that accepts a clock signal tapped 110 from the ART clock. The ART replica also receives ART output on synchronization wire 125, which may be used to determine an offset between the ART and the ART replica. The clock synchronization circuitry 105 includes error correction circuitry 120 (e.g., a proportional-integrator control loop), and registers to hold values between error correction iterations.

This architecture enables continuous and simultaneous cross-timestamping of the ART and PTP clocks and error correction in the NIC 100 hardware at the same time at much faster rate than the current methods. This is possible because the ART clock is routed 110 directly to the NIC 100. Having both ART clock and PTP clock within the NIC 100 enables the NIC to sample these clocks more precisely and simultaneously. Accordingly, propagation delays associated with routing of a sync. control "SyncCTR" signal from PMC to NIC are eliminated. Also, having both ART and PTP timers within the NIC 100 eliminates sequential operation of downstream read transactions and delays associated with software sampling techniques. Continuous cross-timestamping of the ART and the PTP clocks and error correction using an integrated proportional-integral (PI) control loop (e.g., error correction circuitry 120) within the NIC 100 achieves more precise clock synchronization with sub nanosecond accuracy.

The ART replica 115 may be a free running clock similar to that of ART timer in the PMC. In an example, the only difference between these two ART timers is the offset (c1), which is a static value computed by the NIC 100 from reading the ART timestamp (e.g., from the synchronization wire 125). In an example, the clock synchronization circuitry 100 includes the ART replica 115, multiplier (m) circuitry, an accumulator (c2), and the error correction PI control loop (error correction circuitry 120). The output of the error correction circuitry 120 may be written to memory 130 and used by operating system timekeeping component 135 (e.g., clock software) to provide a local time corrected to the network time value.

Because of the closed loop operation, any clock drift is corrected before becoming large, a failing of current method due to infrequent sampling frequencies (typically at eight Hz as compared to less than ten MHz). As noted above, it may be possible for the software of current techniques to interpolate between two samples and do perform more frequent corrections, but this is possible only when clock drift is uniform—meaning that the drift is always in one direction at a constant (e.g., linear) rate. In many industrial applications, these conditions often do not apply, such as when operating temperatures vary, possibly affecting drift.

In an example, a new CPU instruction, similar to RDTSC, may be used. Here, the CPU instruction obtains the values m, c1, and c2 can from a new CPU leaf ID. Here, the variables m, c1, and c2 define the relationship between the CPU TSC and the NIC PTP clock. C1 is an offset between the ART and the ART replica, C2 is an offset from the local clock and the PTP clock, and m is a ratio of PTP clock frequency to ART clock frequency. The multiplier m is used to smooth the correction to avoid sudden jumps in clock values due to the correction, as well as prevent the clock from moving backwards.

The following examples illustrate the operation of the clock synchronization circuitry 105 for synchronizing a real-time clock and a network clock. Thus, the clock synchronization circuitry 105 is configured to receive a signal (e.g., via signal line 125) from an always-running timer (ART) for a compute device at the NIC 100. In an example, the ART is included in a PMC of the compute device. The clock synchronization circuitry 105 is configured to run the ART replica 115 is run inside the NIC 100. Here, the ART replica 155 may have its own oscillator or use the oscillator signal 110 that is used for the PMC ART. The later has the advantage of eliminating drift between the two ARTs.

The clock synchronization circuitry 105 is configured to compare the ART signal to output of the ART replica 115 to produce an offset (e.g., C1). This offset may be used by the operating system timekeeping component 135 to adjust the TSC obtained from the CPU.

The clock synchronization circuitry 105 is configured to obtain a network time (e.g., from the illustrated PTP timer) from a network node. In an example, a cellular network component (e.g., 5 G GM or gNB) may provide the network time with high precision (e.g., less than 0.1 parts-per-million (PPM) accuracy).

Figure 2:
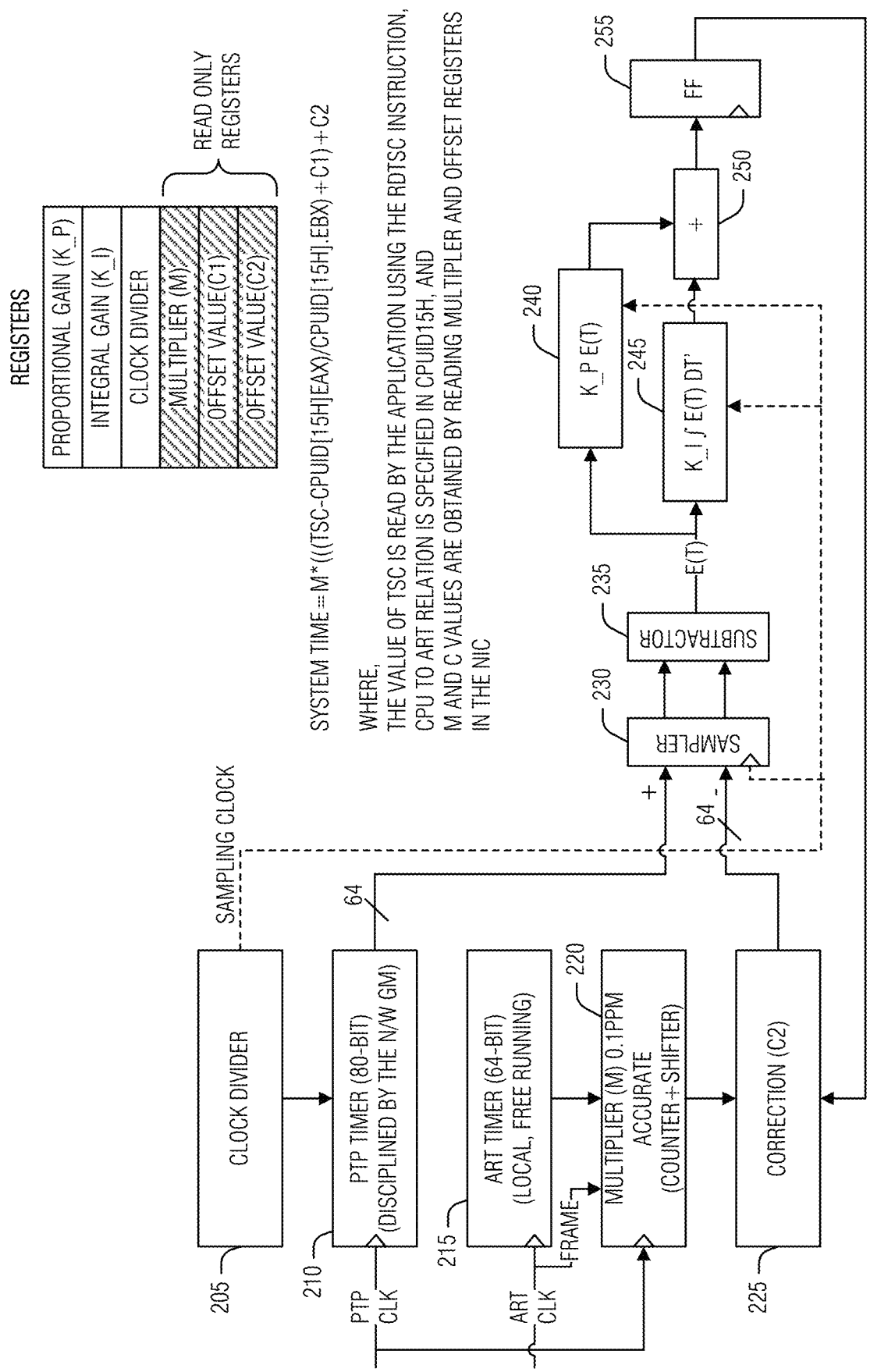
FIG. 2 illustrates an example of proportional integral (PI) control loop, according to an embodiment.

The clock synchronization circuitry 105 is configured to compute an error correction (e.g., via the error correction circuitry 120) from the network time and the output of the ART replica 115. In an example, to compute the error correction, the clock synchronization circuitry 105 is configured to use a proportional integration control loop (e.g., as illustrated in FIG. 2). In an example, the error correction includes an error accumulation (e.g., c2). In an example, the error correction includes a multiplier (e.g., m). In conjunction, the offset c1, the error accumulation c2, and the multiplier m completely describe the difference between the ART-based CPU TSC and the network PTP time.

In an example, the clock synchronization circuitry 105 is configured to sample the network time and the ART replica 115 output continually at a given frequency. Here, the network time is received continually. The error correction may then be computed after each sampling of the network time. In an example, the frequency is greater than ten megahertz.

The clock synchronization circuitry 105 is configured to write the offset and the error correction to working memory 130 of the compute device. Continually updated the memory 130 enables the values therein to always be up-to-date (e.g., within the sampling frequency of the clock synchronization circuitry 105). Thus, whenever the operating system timekeeping component 135 produces the system clock, the timekeeping need only perform a read from the memory 130 to obtain the correction values. This reduces the primary delays in existing techniques, producing much greater synchronization accuracy.

In an example, the CPU, under instruction from the operating system, is configured to read the offset and the error correction from the working memory 130. The CPU time (e.g., TSC) based on the ART is also obtained. From these values, the system time for the compute device is derived by applying the offset and the error correction to the CPU time. In an example, a single CPU instruction reads the offset and the error and obtains the CPU time. This instruction is an enhancement to the current RDTSC (e.g., read TSC) instruction.

In an example, the NIC 100 is a network appliance with memory and processing circuitry. The processing circuitry, when configured by instructions in the memory, operates to perform the actions of the clock synchronization circuitry 105 described above. In an example, the network appliance includes the compute device such that the NIC 100 is included in the network appliance.

FIG. 2 illustrates an example of proportional integral (PI) control loop, according to an embodiment. The illustrated PI control logic has a 64-bit comparator 230 that continuously samples ART 215 and PTP 210 timestamps and sends them to a subtractor 235 to generate an instantaneous phase error. The clocks are frequency adjusted using a dynamic multiplier 220 which computes the frequency ratio through a counter that counts the number of PTP 210 clock ticks with reference to the ART clock 215 frame synchronization signal. The generated phase error is fed to proportional and integral circuitry illustrated in elements 240-255. The error convergence time may be adjusted in the proportional circuitry 240 and the integral circuitry 245 by setting the Kp and Ki variables in registers of the NIC. The proportional circuitry 240 is configured to multiply the error with Kp, feeding the output to an adder circuit 250. The integral circuitry 245 is configured to multiply the error with Ki and then add the error to a previously accumulated error value. The result is fed into the adder circuit 250 at the final stage 255 the PI control loop.

The resultant value is the instantaneous error correction value. In an example, this value is accumulated in the ART circuitry 215. Thus, the ART circuitry 215 holds the accumulated error, c2. In an example, the computed values m, c1, and c2 are written to working memory of the system (e.g., via direct memory access (DMA)). In an example, the location into which these values are written is dedicated (e.g., reserved) to hold these values. Such as dedicated location may enable, for example, a single CPU command to both retrieve the values along with the TSC.

In an example, the values, at least m and c2, are computed and updated, by the NIC, for every sampling period. In an example, the sampling frequency is derived by PTP timer 210 using a clock divider 205. Given the values for c1, c2 and the frequency multiplier m, the system time may be computed with the following equation:

$$\text{System Time} = m\left(\frac{TSC - CPUID[15H].EAX}{CPUID[15H].EBX} + c1\right) + c2$$

Here, the value of TSC may be read by the operating system timekeeping application using the RDTSC instruction, the CPU to ART relation is specified in the CPUID[15H] register, and the m, c1, c2 values are obtained by reading these values from the dedicated DDR location.

Figure 3:
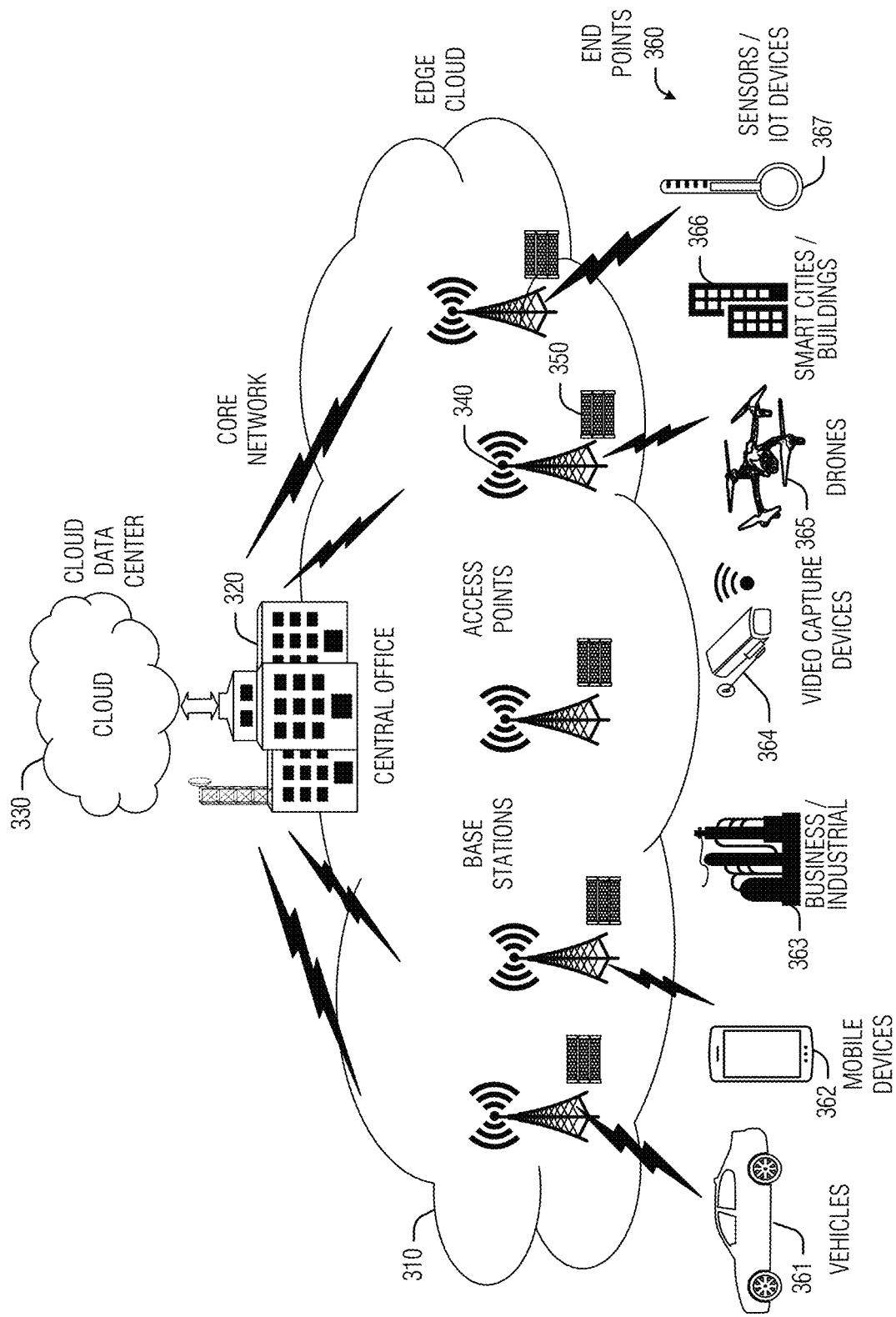
FIG. 3 illustrates an overview of an Edge cloud configuration for Edge computing.

FIG. 3 is a block diagram 300 showing an overview of a configuration for Edge computing, which includes a layer of processing referred to in many of the following examples as an "Edge cloud". As shown, the Edge cloud 310 is co-located at an Edge location, such as an access point or base station 340, a local processing hub 350, or a central office 320, and thus may include multiple entities, devices, and equipment instances. The Edge cloud 310 is located much closer to the endpoint (consumer and producer) data sources 360 (e.g., autonomous vehicles 361, user equipment 362, business and industrial equipment 363, video capture devices 364, drones 365, smart cities and building devices 366, sensors and IoT devices 367, etc.) than the cloud data center 330. Compute, memory, and storage resources which are offered at the edges in the Edge cloud 310 are critical to providing ultra-low latency response times for services and functions used by the endpoint data sources 360 as well as reduce network backhaul traffic from the Edge cloud 310 toward cloud data center 330 thus improving energy consumption and overall network usages among other benefits.

Compute, memory, and storage are scarce resources, and generally decrease depending on the Edge location (e.g., fewer processing resources being available at consumer endpoint devices, than at a base station, than at a central office). However, the closer that the Edge location is to the endpoint (e.g., user equipment (UE)), the more that space and power is often constrained. Thus, Edge computing attempts to reduce the amount of resources needed for network services, through the distribution of more resources which are located closer both geographically and in network access time. In this manner, Edge computing attempts to bring the compute resources to the workload data where appropriate, or, bring the workload data to the compute resources.

The following describes aspects of an Edge cloud architecture that covers multiple potential deployments and addresses restrictions that some network operators or service providers may have in their own infrastructures. These include, variation of configurations based on the Edge location (because edges at a base station level, for instance, may have more constrained performance and capabilities in a multi-tenant scenario); configurations based on the type of compute, memory, storage, fabric, acceleration, or like resources available to Edge locations, tiers of locations, or groups of locations; the service, security, and management and orchestration capabilities; and related objectives to achieve usability and performance of end services. These deployments may accomplish processing in network layers that may be considered as "near Edge", "close Edge", "local Edge", "middle Edge", or "far Edge" layers, depending on latency, distance, and timing characteristics.

Edge computing is a developing paradigm where computing is performed at or closer to the "Edge" of a network, typically through the use of a compute platform (e.g., x86 or ARM compute hardware architecture) implemented at base stations, gateways, network routers, or other devices which are much closer to endpoint devices producing and consuming the data. For example, Edge gateway servers may be equipped with pools of memory and storage resources to perform computation in real-time for low latency use-cases (e.g., autonomous driving or video surveillance) for connected client devices. Or as an example, base stations may be augmented with compute and acceleration resources to directly process service workloads for connected user equipment, without further communicating data via backhaul networks. Or as another example, central office network management hardware may be replaced with standardized compute hardware that performs virtualized network functions and offers compute resources for the execution of services and consumer functions for connected devices. Within Edge computing networks, there may be scenarios in services which the compute resource will be "moved" to the data, as well as scenarios in which the data will be "moved" to the compute resource. Or as an example, base station compute, acceleration and network resources can provide services in order to scale to workload demands on an as needed basis by activating dormant capacity (subscription, capacity on demand) in order to manage corner cases, emergencies or to provide longevity for deployed resources over a significantly longer implemented lifecycle.

Figure 4:
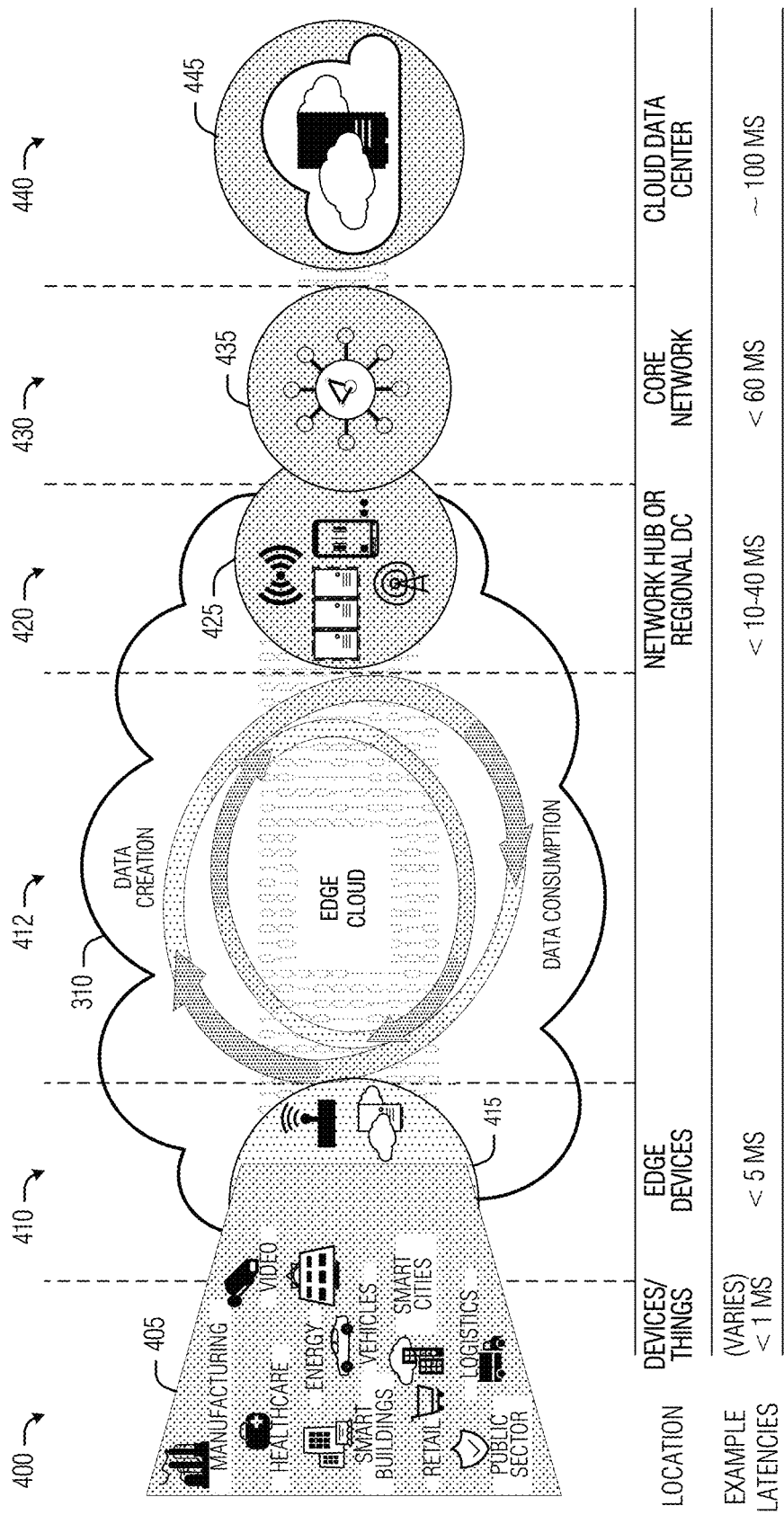
FIG. 4 illustrates operational layers among endpoints, an Edge cloud, and cloud computing environments.

FIG. 4 illustrates operational layers among endpoints, an Edge cloud, and cloud computing environments. Specifically, FIG. 4 depicts examples of computational use cases 405, utilizing the Edge cloud 310 among multiple illustrative layers of network computing. The layers begin at an endpoint (devices and things) layer 400, which accesses the Edge cloud 310 to conduct data creation, analysis, and data consumption activities. The Edge cloud 310 may span multiple network layers, such as an Edge devices layer 410 having gateways, on-premise servers, or network equipment (nodes 415) located in physically proximate Edge systems; a network access layer 420, encompassing base stations, radio processing units, network hubs, regional data centers (DC), or local network equipment (equipment 425); and any equipment, devices, or nodes located therebetween (in layer 412, not illustrated in detail). The network communications within the Edge cloud 310 and among the various layers may occur via any number of wired or wireless mediums, including via connectivity architectures and technologies not depicted.

Examples of latency, resulting from network communication distance and processing time constraints, may range from less than a millisecond (ms) when among the endpoint layer 400, under 5 ms at the Edge devices layer 410, to even between 10 to 40 ms when communicating with nodes at the network access layer 420. Beyond the Edge cloud 310 are core network 430 and cloud data center 440 layers, each with increasing latency (e.g., between 50-60 ms at the core network layer 430, to 100 or more ms at the cloud data center layer). As a result, operations at a core network data center 435 or a cloud data center 445, with latencies of at least 50 to 100 ms or more, will not be able to accomplish many time-critical functions of the use cases 405. Each of these latency values are provided for purposes of illustration and contrast; it will be understood that the use of other access network mediums and technologies may further reduce the latencies. In some examples, respective portions of the network may be categorized as "close Edge", "local Edge", "near Edge", "middle Edge", or "far Edge" layers, relative to a network source and destination. For instance, from the perspective of the core network data center 435 or a cloud data center 445, a central office or content data network may be considered as being located within a "near Edge" layer ("near" to the cloud, having high latency values when communicating with the devices and endpoints of the use cases 405), whereas an access point, base station, on-premise server, or network gateway may be considered as located within a "far Edge" layer ("far" from the cloud, having low latency values when communicating with the devices and endpoints of the use cases 405). It will be understood that other categorizations of a particular network layer as constituting a "close", "local", "near", "middle", or "far" Edge may be based on latency, distance, number of network hops, or other measurable characteristics, as measured from a source in any of the network layers 400-440.

The various use cases 405 may access resources under usage pressure from incoming streams, due to multiple services utilizing the Edge cloud. To achieve results with low latency, the services executed within the Edge cloud 310 balance varying requirements in terms of: (a) Priority (throughput or latency) and Quality of Service (QoS) (e.g., traffic for an autonomous car may have higher priority than a temperature sensor in terms of response time requirement; or, a performance sensitivity/bottleneck may exist at a compute/accelerator, memory, storage, or network resource, depending on the application); (b) Reliability and Resiliency (e.g., some input streams need to be acted upon and the traffic routed with mission-critical reliability, where as some other input streams may be tolerate an occasional failure, depending on the application); and (c) Physical constraints (e.g., power, cooling and form-factor, etc.).

The end-to-end service view for these use cases involves the concept of a service-flow and is associated with a transaction. The transaction details the overall service requirement for the entity consuming the service, as well as the associated services for the resources, workloads, workflows, and business functional and business level requirements. The services executed with the "terms" described may be managed at each layer in a way to assure real time, and runtime contractual compliance for the transaction during the lifecycle of the service. When a component in the transaction is missing its agreed to Service Level Agreement (SLA), the system as a whole (components in the transaction) may provide the ability to (1) understand the impact of the SLA violation, and (2) augment other components in the system to resume overall transaction SLA, and (3) implement steps to remediate.

Thus, with these variations and service features in mind, Edge computing within the Edge cloud 310 may provide the ability to serve and respond to multiple applications of the use cases 405 (e.g., object tracking, video surveillance, connected cars, etc.) in real-time or near real-time, and meet ultra-low latency requirements for these multiple applications. These advantages enable a whole new class of applications (e.g., Virtual Network Functions (VNFs), Function as a Service (FaaS), Edge as a Service (EaaS), standard processes, etc.), which cannot leverage conventional cloud computing due to latency or other limitations.

However, with the advantages of Edge computing comes the following caveats. The devices located at the Edge are often resource constrained and therefore there is pressure on usage of Edge resources. Typically, this is addressed through the pooling of memory and storage resources for use by multiple users (tenants) and devices. The Edge may be power and cooling constrained and therefore the power usage needs to be accounted for by the applications that are consuming the most power. There may be inherent power-performance tradeoffs in these pooled memory resources, as many of them are likely to use emerging memory technologies, where more power requires greater memory bandwidth. Likewise, improved security of hardware and root of trust trusted functions are also required, because Edge locations may be unmanned and may even need permissioned access (e.g., when housed in a third-party location). Such issues are magnified in the Edge cloud 310 in a multi-tenant, multi-owner, or multi-access setting, where services and applications are requested by many users, especially as network usage dynamically fluctuates and the composition of the multiple stakeholders, use cases, and services changes.

At a more generic level, an Edge computing system may be described to encompass any number of deployments at the previously discussed layers operating in the Edge cloud 310 (network layers 400-440), which provide coordination from client and distributed compute devices. One or more Edge gateway nodes, one or more Edge aggregation nodes, and one or more core data centers may be distributed across layers of the network to provide an implementation of the Edge computing system by or on behalf of a telecommunication service provider ("telco", or "TSP"), internet-of-things service provider, cloud service provider (CSP), enterprise entity, or any other number of entities. Various implementations and configurations of the Edge computing system may be provided dynamically, such as when orchestrated to meet service objectives.

Consistent with the examples provided herein, a client compute node may be embodied as any type of endpoint component, device, appliance, or other thing capable of communicating as a producer or consumer of data. Further, the label "node" or "device" as used in the Edge computing system does not necessarily mean that such node or device operates in a client or agent/minion/follower role; rather, any of the nodes or devices in the Edge computing system refer to individual entities, nodes, or subsystems which include discrete or connected hardware or software configurations to facilitate or use the Edge cloud 310.

As such, the Edge cloud 310 is formed from network components and functional features operated by and within Edge gateway nodes, Edge aggregation nodes, or other Edge compute nodes among network layers 410-430. The Edge cloud 310 thus may be embodied as any type of network that provides Edge computing or storage resources which are proximately located to radio access network (RAN) capable endpoint devices (e.g., mobile compute devices, IoT devices, smart devices, etc.), which are discussed herein. In other words, the Edge cloud 310 may be envisioned as an "Edge" which connects the endpoint devices and traditional network access points that serve as an ingress point into service provider core networks, including mobile carrier networks (e.g., Global System for Mobile Communications (GSM) networks, Long-Term Evolution (LTE) networks, 5 G/6 G networks, etc.), while also providing storage or compute capabilities. Other types and forms of network access (e.g., Wi-Fi, long-range wireless, wired networks including optical networks, etc.) may also be utilized in place of or in combination with such 3GPP carrier networks.

The network components of the Edge cloud 310 may be servers, multi-tenant servers, appliance compute devices, or any other type of compute devices. For example, the Edge cloud 310 may include an appliance compute device that is a self-contained electronic device including a housing, a chassis, a case, or a shell. In some circumstances, the housing may be dimensioned for portability such that it can be carried by a human or shipped. Example housings may include materials that form one or more exterior surfaces that partially or fully protect contents of the appliance, in which protection may include weather protection, hazardous environment protection (e.g., electromagnetic interference (EMI), vibration, extreme temperatures, etc.), or enable submergibility. Example housings may include power circuitry to provide power for stationary or portable implementations, such as alternating current (AC) power inputs, direct current (DC) power inputs, AC/DC converter(s), DC/AC converter(s), DC/DC converter(s), power regulators, transformers, charging circuitry, batteries, wired inputs, or wireless power inputs. Example housings or surfaces thereof may include or connect to mounting hardware to enable attachment to structures such as buildings, telecommunication structures (e.g., poles, antenna structures, etc.), or racks (e.g., server racks, blade mounts, etc.). Example housings or surfaces thereof may support one or more sensors (e.g., temperature sensors, vibration sensors, light sensors, acoustic sensors, capacitive sensors, proximity sensors, infrared or other visual thermal sensors, etc.). One or more such sensors may be contained in, carried by, or otherwise embedded in the surface or mounted to the surface of the appliance. Example housings or surfaces thereof may support mechanical connectivity, such as propulsion hardware (e.g., wheels, rotors such as propellers, etc.) or articulating hardware (e.g., robot arms, pivotable appendages, etc.). In some circumstances, the sensors may include any type of input devices such as user interface hardware (e.g., buttons, switches, dials, sliders, microphones, etc.). In some circumstances, example housings include output devices contained in, carried by, embedded therein or attached thereto. Output devices may include displays, touchscreens, lights, light-emitting diodes (LEDs), speakers, input/output (I/O) ports (e.g., universal serial bus (USB)), etc. In some circumstances, Edge devices are devices presented in the network for a specific purpose (e.g., a traffic light), but may have processing or other capacities that may be utilized for other purposes. Such Edge devices may be independent from other networked devices and may be provided with a housing having a form factor suitable for its primary purpose; yet be available for other compute tasks that do not interfere with its primary task. Edge devices include Internet of Things devices. The appliance compute device may include hardware and software components to manage local issues such as device temperature, vibration, resource utilization, updates, power issues, physical and network security, etc. Example hardware for implementing an appliance compute device is described in conjunction with FIG. 6B. The Edge cloud 310 may also include one or more servers or one or more multi-tenant servers. Such a server may include an operating system and implement a virtual computing environment. A virtual computing environment may include a hypervisor managing (e.g., spawning, deploying, commissioning, destroying, decommissioning, etc.) one or more virtual machines, one or more containers, etc. Such virtual computing environments provide an execution environment in which one or more applications or other software, code, or scripts may execute while being isolated from one or more other applications, software, code, or scripts.

Figure 5:
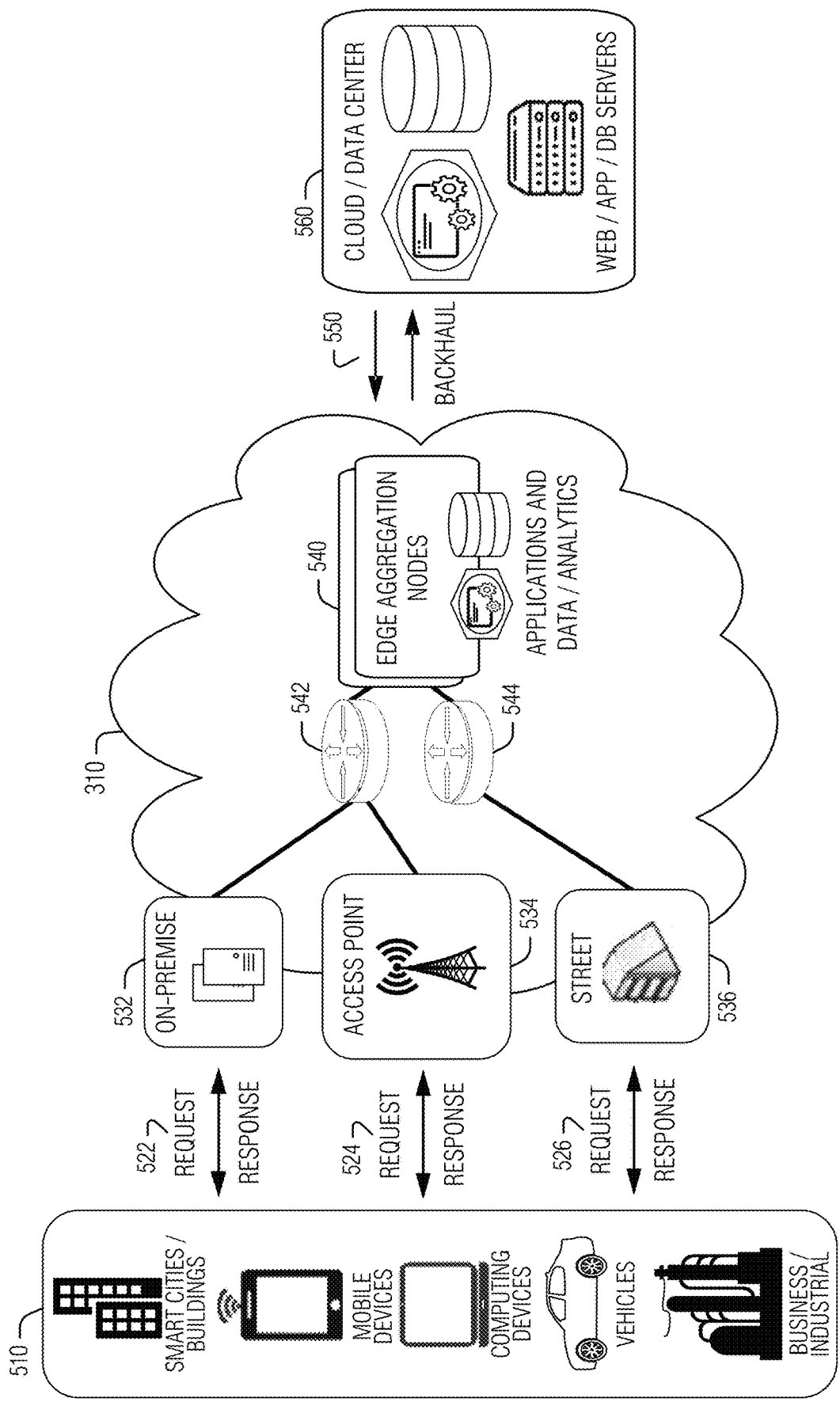
FIG. 5 illustrates an example approach for networking and services in an Edge computing system.

In FIG. 5, various client endpoints 510 (in the form of mobile devices, computers, autonomous vehicles, business computing equipment, industrial processing equipment) exchange requests and responses that are specific to the type of endpoint network aggregation. For instance, client endpoints 510 may obtain network access via a wired broadband network, by exchanging requests and responses 522 through an on-premise network system 532. Some client endpoints 510, such as mobile compute devices, may obtain network access via a wireless broadband network, by exchanging requests and responses 524 through an access point (e.g., a cellular network tower) 534. Some client endpoints 510, such as autonomous vehicles may obtain network access for requests and responses 526 via a wireless vehicular network through a street-located network system 536. However, regardless of the type of network access, the TSP may deploy aggregation points 542, 544 within the Edge cloud 310 to aggregate traffic and requests. Thus, within the Edge cloud 310, the TSP may deploy various compute and storage resources, such as at Edge aggregation nodes 540, to provide requested content. The Edge aggregation nodes 540 and other systems of the Edge cloud 310 are connected to a cloud or data center 560, which uses a backhaul network 550 to fulfill higher-latency requests from a cloud/data center for websites, applications, database servers, etc. Additional or consolidated instances of the Edge aggregation nodes 540 and the aggregation points 542, 544, including those deployed on a single server framework, may also be present within the Edge cloud 310 or other areas of the TSP infrastructure.

In further examples, any of the compute nodes or devices discussed with reference to the present Edge computing systems and environment may be fulfilled based on the components depicted in FIGS. 6A and 6B. Respective Edge compute nodes may be embodied as a type of device, appliance, computer, or other "thing" capable of communicating with other Edge, networking, or endpoint components. For example, an Edge compute device may be embodied as a personal computer, server, smartphone, a mobile compute device, a smart appliance, an in-vehicle compute system (e.g., a navigation system), a self-contained device having an outer case, shell, etc., or other device or system capable of performing the described functions.

Figure 6A:
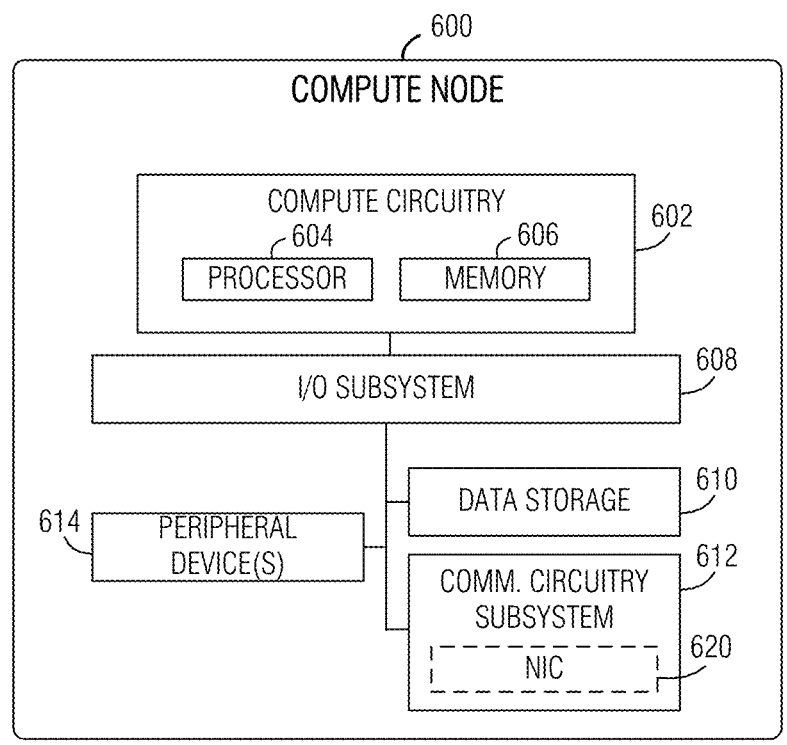
FIG. 6A provides an overview of example components for compute deployed at a compute node in an Edge computing system.

In the simplified example depicted in FIG. 6A, an Edge compute node 600 includes a compute engine (also referred to herein as "compute circuitry") 602, an input/output (I/O) subsystem (also referred to herein as "I/O circuitry") 608, data storage (also referred to herein as "data storage circuitry") 610, a communication circuitry subsystem 612, and, optionally, one or more peripheral devices (also referred to herein as "peripheral device circuitry") 614. In other examples, respective compute devices may include other or additional components, such as those typically found in a computer (e.g., a display, peripheral devices, etc.). Additionally, in some examples, one or more of the illustrative components may be incorporated in, or otherwise form a portion of, another component.

The compute node 600 may be embodied as any type of engine, device, or collection of devices capable of performing various compute functions. In some examples, the compute node 600 may be embodied as a single device such as an integrated circuit, an embedded system, a field-programmable gate array (FPGA), a system-on-a-chip (SOC), or other integrated system or device. In the illustrative example, the compute node 600 includes or is embodied as a processor (also referred to herein as "processor circuitry") 604 and a memory (also referred to herein as "memory circuitry") 606. The processor 604 may be embodied as any type of processor(s) capable of performing the functions described herein (e.g., executing an application). For example, the processor 604 may be embodied as a multi-core processor(s), a microcontroller, a processing unit, a specialized or special purpose processing unit, or other processor or processing/controlling circuit.

In some examples, the processor 604 may be embodied as, include, or be coupled to an FPGA, an application specific integrated circuit (ASIC), reconfigurable hardware or hardware circuitry, or other specialized hardware to facilitate performance of the functions described herein. Also in some examples, the processor 604 may be embodied as a specialized x-processing unit (xPU) also known as a data processing unit (DPU), infrastructure processing unit (IPU), or network processing unit (NPU). Such an xPU may be embodied as a standalone circuit or circuit package, integrated within an SOC, or integrated with networking circuitry (e.g., in a SmartNIC, or enhanced SmartNIC), acceleration circuitry, storage devices, storage disks, or AI hardware (e.g., GPUs, programmed FPGAs, or ASICs tailored to implement an AI model such as a neural network). Such an xPU may be designed to receive, retrieve, or otherwise obtain programming to process one or more data streams and perform specific tasks and actions for the data streams (such as hosting microservices, performing service management or orchestration, organizing or managing server or data center hardware, managing service meshes, or collecting and distributing telemetry), outside of the CPU or general purpose processing hardware. However, it will be understood that an xPU, an SOC, a CPU, and other variations of the processor 604 may work in coordination with each other to execute many types of operations and instructions within and on behalf of the compute node 600.

The memory 606 may be embodied as any type of volatile (e.g., dynamic random access memory (DRAM), etc.) or non-volatile memory or data storage capable of performing the functions described herein. Volatile memory may be a storage medium that requires power to maintain the state of data stored by the medium. Non-limiting examples of volatile memory may include various types of random access memory (RAM), such as DRAM or static random access memory (SRAM). One particular type of DRAM that may be used in a memory module is synchronous dynamic random access memory (SDRAM).

In an example, the memory device (e.g., memory circuitry) is any number of block addressable memory devices, such as those based on NAND or NOR technologies (for example, Single-Level Cell ("SLC"), Multi-Level Cell ("MLC"), Quad-Level Cell ("QLC"), Tri-Level Cell ("TLC"), or some other NAND). In some examples, the memory device(s) includes a byte-addressable write-in-place three dimensional crosspoint memory device, or other byte addressable write-in-place non-volatile memory (NVM) devices, such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric transistor random access memory (FeTRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, a combination of any of the above, or other suitable memory. A memory device may also include a three-dimensional crosspoint memory device (e.g., Intel® 3D XPoint™ memory), or other byte addressable write-in-place nonvolatile memory devices. The memory device may refer to the die itself or to a packaged memory product. In some examples, 3D crosspoint memory (e.g., Intel® 3D XPoint™ memory) may include a transistor-less stackable cross point architecture in which memory cells sit at the intersection of word lines and bit lines and are individually addressable and in which bit storage is based on a change in bulk resistance. In some examples, all or a portion of the memory 606 may be integrated into the processor 604. The memory 606 may store various software and data used during operation such as one or more applications, data operated on by the application(s), libraries, and drivers.

In some examples, resistor-based or transistor-less memory architectures include nanometer scale phase-change memory (PCM) devices in which a volume of phase-change material resides between at least two electrodes. Portions of the example phase-change material exhibit varying degrees of crystalline phases and amorphous phases, in which varying degrees of resistance between the at least two electrodes can be measured. In some examples, the phase-change material is a chalcogenide-based glass material. Such resistive memory devices are sometimes referred to as memristive devices that remember the history of the current that previously flowed through them. Stored data is retrieved from example PCM devices by measuring the electrical resistance, in which the crystalline phases exhibit a relatively lower resistance value(s) (e.g., logical "0") when compared to the amorphous phases having a relatively higher resistance value(s) (e.g., logical "1").

Example PCM devices store data for long periods of time (e.g., approximately 10 years at room temperature). Write operations to example PCM devices (e.g., set to logical "0", set to logical "1", set to an intermediary resistance value) are accomplished by applying one or more current pulses to the at least two electrodes, in which the pulses have a particular current magnitude and duration. For instance, a long low current pulse (SET) applied to the at least two electrodes causes the example PCM device to reside in a low-resistance crystalline state, while a comparatively short high current pulse (RESET) applied to the at least two electrodes causes the example PCM device to reside in a high-resistance amorphous state.

In some examples, implementation of PCM devices facilitates non-von Neumann computing architectures that enable in-memory computing capabilities. Generally speaking, traditional computing architectures include a central processing unit (CPU) communicatively connected to one or more memory devices via a bus. As such, a finite amount of energy and time is consumed to transfer data between the CPU and memory, which is a known bottleneck of von Neumann computing architectures. However, PCM devices minimize and, in some cases, eliminate data transfers between the CPU and memory by performing some computing operations in-memory. Stated differently, PCM devices both store information and execute computational tasks. Such non-von Neumann computing architectures may implement vectors having a relatively high dimensionality to facilitate hyperdimensional computing, such as vectors having 10,000 bits. Relatively large bit width vectors enable computing paradigms modeled after the human brain, which also processes information analogous to wide bit vectors.

The compute circuitry 602 is communicatively coupled to other components of the compute node 600 via the I/O subsystem 608, which may be embodied as circuitry or components to facilitate input/output operations with the compute circuitry 602 (e.g., with the processor 604 or the main memory 606) and other components of the compute circuitry 602. For example, the I/O subsystem 608 may be embodied as, or otherwise include, memory controller hubs, input/output control hubs, integrated sensor hubs, firmware devices, communication links (e.g., point-to-point links, bus links, wires, cables, light guides, printed circuit board traces, etc.), or other components and subsystems to facilitate the input/output operations. In some examples, the I/O subsystem 608 may form a portion of a system-on-a-chip (SoC) and be incorporated, along with one or more of the processor 604, the memory 606, and other components of the compute circuitry 602, into the compute circuitry 602.

The one or more illustrative data storage devices/disks 610 may be embodied as one or more of any type(s) of physical device(s) configured for short-term or long-term storage of data such as, for example, memory devices, memory, circuitry, memory cards, flash memory, hard disk drives (HDDs), solid-state drives (SSDs), or other data storage devices/disks. Individual data storage devices/disks 610 may include a system partition that stores data and firmware code for the data storage device/disk 610. Individual data storage devices/disks 610 may also include one or more operating system partitions that store data files and executables for operating systems depending on, for example, the type of compute node 600.

The communication circuitry 612 may be embodied as any communication circuit, device, or collection thereof, capable of enabling communications over a network between the compute circuitry 602 and another compute device (e.g., an Edge gateway of an implementing Edge computing system). The communication circuitry 612 may be configured to use any one or more communication technology (e.g., wired or wireless communications) and associated protocols (e.g., a cellular networking protocol such a 3GPP 4 G or 5 G standard, a wireless local area network protocol such as IEEE 802.11/Wi-Fi®, a wireless wide area network protocol, Ethernet, Bluetooth®, Bluetooth Low Energy, a IoT protocol such as IEEE 802.15.4 or ZigBee®, low-power wide-area network (LPWAN) or low-power wide-area (LPWA) protocols, etc.) to effect such communication.

The illustrative communication circuitry 612 includes a network interface controller (NIC) 620, which may also be referred to as a host fabric interface (HFI). The NIC 620 may be embodied as one or more add-in-boards, daughter cards, network interface cards, controller chips, chipsets, or other devices that may be used by the compute node 600 to connect with another compute device (e.g., an Edge gateway node). In some examples, the NIC 620 may be embodied as part of a system-on-a-chip (SoC) that includes one or more processors, or included on a multichip package that also contains one or more processors. In some examples, the NIC 620 may include a local processor (not shown) or a local memory (not shown) that are both local to the NIC 620. In such examples, the local processor of the NIC 620 may be capable of performing one or more of the functions of the compute circuitry 602 described herein. Additionally, or alternatively, in such examples, the local memory of the NIC 620 may be integrated into one or more components of the client compute node at the board level, socket level, chip level, or other levels.

Additionally, in some examples, a respective compute node 600 may include one or more peripheral devices 614. Such peripheral devices 614 may include any type of peripheral device found in a compute device or server such as audio input devices, a display, other input/output devices, interface devices, or other peripheral devices, depending on the particular type of the compute node 600. In further examples, the compute node 600 may be embodied by a respective Edge compute node (whether a client, gateway, or aggregation node) in an Edge computing system or like forms of appliances, computers, subsystems, circuitry, or other components.

Figure 6B:
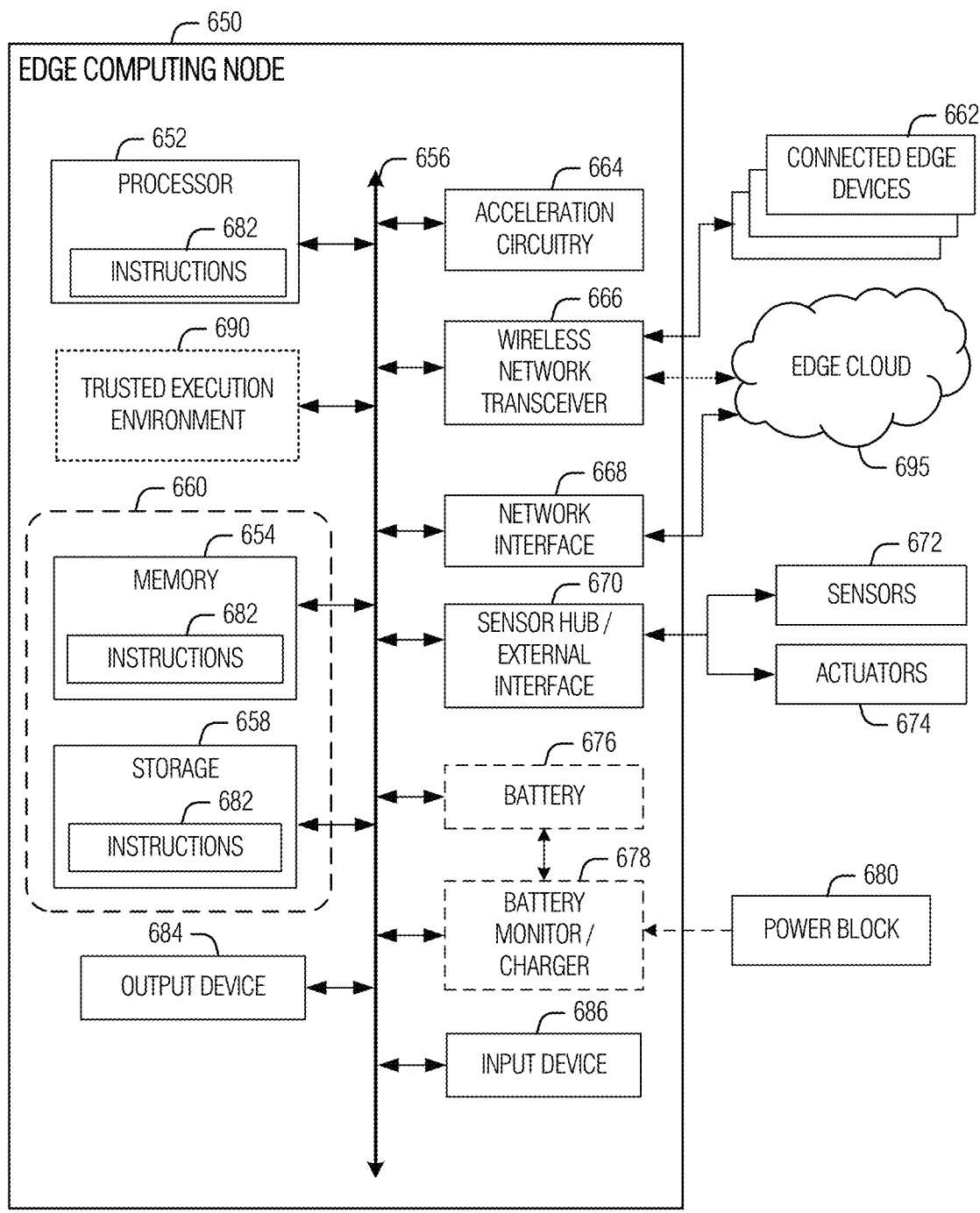
FIG. 6B provides a further overview of example components within a compute device in an Edge computing system.

In a more detailed example, FIG. 6B illustrates a block diagram of an example of components that may be present in an Edge computing node 650 for implementing the techniques (e.g., operations, processes, methods, and methodologies) described herein. This Edge computing node 650 provides a closer view of the respective components of node 600 when implemented as or as part of a compute device (e.g., as a mobile device, a base station, server, gateway, etc.). The Edge computing node 650 may include any combination of the hardware or logical components referenced herein, and it may include or couple with any device usable with an Edge communication network or a combination of such networks. The components may be implemented as integrated circuits (ICs), portions thereof, discrete electronic devices, or other modules, instruction sets, programmable logic or algorithms, hardware, hardware accelerators, software, firmware, or a combination thereof adapted in the Edge computing node 650, or as components otherwise incorporated within a chassis of a larger system.

The Edge compute device 650 may include processing circuitry in the form of a processor 652, which may be a microprocessor, a multi-core processor, a multithreaded processor, an ultra-low voltage processor, an embedded processor, an xPU/DPU/IPU/NPU, special purpose processing unit, specialized processing unit, or other known processing elements. The processor 652 may be a part of a system on a chip (SoC) in which the processor 652 and other components are formed into a single integrated circuit, or a single package, such as the Edison™ or Galileo™ SoC boards from Intel Corporation, Santa Clara, California As an example, the processor 652 may include an Intel® Architecture Core™ based CPU processor, such as a Quark™, an Atom™, an i3, an i5, an i7, an i9, or an MCU-class processor, or another such processor available from Intel®. However, any number other processors may be used, such as available from Advanced Micro Devices, Inc. (AMD®) of Sunnyvale, California, a MIPS®-based design from MIPS Technologies, Inc. of Sunnyvale, California, an ARM®-based design licensed from ARM Holdings, Ltd. or a customer thereof, or their licensees or adopters. The processors may include units such as an A5-A13 processor from Apple® Inc., a Snapdragon™ processor from Qualcomm® Technologies, Inc., or an OMAP™ processor from Texas Instruments, Inc. The processor 652 and accompanying circuitry may be provided in a single socket form factor, multiple socket form factor, or a variety of other formats, including in limited hardware configurations or configurations that include fewer than all elements shown in FIG. 6B.

The processor 652 may communicate with a system memory 654 over an interconnect 656 (e.g., a bus). Any number of memory devices may be used to provide for a given amount of system memory. As examples, the memory 654 may be random access memory (RAM) in accordance with a Joint Electron Devices Engineering Council (JEDEC) design such as the DDR or mobile DDR standards (e.g., LPDDR, LPDDR2, LPDDR3, or LPDDR4). In particular examples, a memory component may comply with a DRAM standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces. In various implementations, the individual memory devices may be of any number of different package types such as single die package (SDP), dual die package (DDP) or quad die package (Q17P). These devices, in some examples, may be directly soldered onto a motherboard to provide a lower profile solution, while in other examples the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs.

To provide for persistent storage of information such as data, applications, operating systems and so forth, a storage 658 may also couple to the processor 652 via the interconnect 656. In an example, the storage 658 may be implemented via a solid-state disk drive (SSDD). Other devices that may be used for the storage 658 include flash memory cards, such as Secure Digital (SD) cards, microSD cards, eXtreme Digital (XD) picture cards, and the like, and Universal Serial Bus (USB) flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ)

based device, a DW (Domain Wall) and SOT (Spin Orbit Transfer) based device, a thyristor based memory device, or a combination of any of the above, or other memory.

In low power implementations, the storage 658 may be on-die memory or registers associated with the processor 652. However, in some examples, the storage 658 may be implemented using a micro hard disk drive (HDD). Further, any number of new technologies may be used for the storage 658 in addition to, or instead of, the technologies described, such resistance change memories, phase change memories, holographic memories, or chemical memories, among others.

The components may communicate over the interconnect 656. The interconnect 656 may include any number of technologies, including industry standard architecture (ISA), extended ISA (EISA), peripheral component interconnect (PCI), peripheral component interconnect extended (PCIx), PCI express (PCIe), or any number of other technologies. The interconnect 656 may be a proprietary bus, for example, used in an SoC based system. Other bus systems may be included, such as an Inter-Integrated Circuit (I2C) interface, a Serial Peripheral Interface (SPI) interface, point to point interfaces, and a power bus, among others.

The interconnect 656 may couple the processor 652 to a transceiver 666, for communications with the connected Edge devices 662. The transceiver 666 may use any number of frequencies and protocols, such as 2.4 Gigahertz (GHz) transmissions under the IEEE 802.15.4 standard, using the Bluetooth® low energy (BLE) standard, as defined by the Bluetooth® Special Interest Group, or the ZigBee® standard, among others. Any number of radios, configured for a particular wireless communication protocol, may be used for the connections to the connected Edge devices 662. For example, a wireless local area network (WLAN) unit may be used to implement Wi-Fi® communications in accordance with the Institute of Electrical and Electronics Engineers (IEEE) 802.11 standard. In addition, wireless wide area communications, e.g., according to a cellular or other wireless wide area protocol, may occur via a wireless wide area network (WWAN) unit.

The wireless network transceiver 666 (or multiple transceivers) may communicate using multiple standards or radios for communications at a different range. For example, the Edge computing node 650 may communicate with close devices, e.g., within about 10 meters, using a local transceiver based on Bluetooth Low Energy (BLE), or another low power radio, to save power. More distant connected Edge devices 662, e.g., within about 50 meters, may be reached over ZigBee® or other intermediate power radios. Both communications techniques may take place over a single radio at different power levels or may take place over separate transceivers, for example, a local transceiver using BLE and a separate mesh transceiver using ZigBee®.

A wireless network transceiver 666 (e.g., a radio transceiver) may be included to communicate with devices or services in a cloud (e.g., an Edge cloud 695) via local or wide area network protocols. The wireless network transceiver 666 may be a low-power wide-area (LPWA) transceiver that follows the IEEE 802.15.4, or IEEE 802.15.4 g standards, among others. The Edge computing node 650 may communicate over a wide area using LoRaWAN™ (Long Range Wide Area Network) developed by Semtech and the LoRa Alliance. The techniques described herein are not limited to these technologies but may be used with any number of other cloud transceivers that implement long range, low bandwidth communications, such as Sigfox, and other technologies. Further, other communications techniques, such as time-slotted channel hopping, described in the IEEE 802.15.4e specification may be used.

Any number of other radio communications and protocols may be used in addition to the systems mentioned for the wireless network transceiver 666, as described herein. For example, the transceiver 666 may include a cellular transceiver that uses spread spectrum (SPA/SAS) communications for implementing high-speed communications. Further, any number of other protocols may be used, such as Wi-Fi® networks for medium speed communications and provision of network communications. The transceiver 666 may include radios that are compatible with any number of 3GPP (Third Generation Partnership Project) specifications, such as Long Term Evolution (LTE) and 5th Generation (5 G) communication systems, discussed in further detail at the end of the present disclosure. A network interface controller (NIC) 668 may be included to provide a wired communication to nodes of the Edge cloud 695 or to other devices, such as the connected Edge devices 662 (e.g., operating in a mesh). The wired communication may provide an Ethernet connection or may be based on other types of networks, such as Controller Area Network (CAN), Local Interconnect Network (LIN), DeviceNet, ControlNet, Data Highway+, PROFIBUS, or PROFINET, among many others. An additional NIC 668 may be included to enable connecting to a second network, for example, a first NIC 668 providing communications to the cloud over Ethernet, and a second NIC 668 providing communications to other devices over another type of network.

Given the variety of types of applicable communications from the device to another component or network, applicable communications circuitry used by the device may include or be embodied by any one or more of components 664, 666, 668, or 670. Accordingly, in various examples, applicable means for communicating (e.g., receiving, transmitting, etc.) may be embodied by such communications circuitry.

The Edge computing node 650 may include or be coupled to acceleration circuitry 664, which may be embodied by one or more artificial intelligence (AI) accelerators, a neural compute stick, neuromorphic hardware, an FPGA, an arrangement of GPUs, an arrangement of xPUs/DPUs/IPU/NPUs, one or more SoCs, one or more CPUs, one or more digital signal processors, dedicated ASICs, or other forms of specialized processors or circuitry designed to accomplish one or more specialized tasks. These tasks may include AI processing (including machine learning, training, inferencing, and classification operations), visual data processing, network data processing, object detection, rule analysis, or the like. These tasks also may include the specific Edge computing tasks for service management and service operations discussed elsewhere in this document.

The interconnect 656 may couple the processor 652 to a sensor hub or external interface 670 that is used to connect additional devices or subsystems. The devices may include sensors 672, such as accelerometers, level sensors, flow sensors, optical light sensors, camera sensors, temperature sensors, global navigation system (e.g., GPS) sensors, pressure sensors, barometric pressure sensors, and the like. The hub or interface 670 further may be used to connect the Edge computing node 650 to actuators 674, such as power switches, valve actuators, an audible sound generator, a visual warning device, and the like.

In some optional examples, various input/output (I/O) devices may be present within or connected to, the Edge computing node 650. For example, a display or other output device 684 may be included to show information, such as sensor readings or actuator position. An input device 686, such as a touch screen or keypad may be included to accept input. An output device 684 may include any number of forms of audio or visual display, including simple visual outputs such as binary status indicators (e.g., light-emitting diodes (LEDs)) and multi-character visual outputs, or more complex outputs such as display screens (e.g., liquid crystal display (LCD) screens), with the output of characters, graphics, multimedia objects, and the like being generated or produced from the operation of the Edge computing node 650. A display or console hardware, in the context of the present system, may be used to provide output and receive input of an Edge computing system; to manage components or services of an Edge computing system; identify a state of an Edge computing component or service; or to conduct any other number of management or administration functions or service use cases.

A battery 676 may power the Edge computing node 650, although, in examples in which the Edge computing node 650 is mounted in a fixed location, it may have a power supply coupled to an electrical grid, or the battery may be used as a backup or for temporary capabilities. The battery 676 may be a lithium ion battery, or a metal-air battery, such as a zinc-air battery, an aluminum-air battery, a lithium-air battery, and the like.

A battery monitor/charger 678 may be included in the Edge computing node 650 to track the state of charge (SoCh) of the battery 676, if included. The battery monitor/charger 678 may be used to monitor other parameters of the battery 676 to provide failure predictions, such as the state of health (SoH) and the state of function (SoF) of the battery 676. The battery monitor/charger 678 may include a battery monitoring integrated circuit, such as an LTC4020 or an LTC2990 from Linear Technologies, an ADT7488A from ON Semiconductor of Phoenix Arizona, or an IC from the UCD90xxx family from Texas Instruments of Dallas, Texas The battery monitor/charger 678 may communicate the information on the battery 676 to the processor 652 over the interconnect 656. The battery monitor/charger 678 may also include an analog-to-digital (ADC) converter that enables the processor 652 to directly monitor the voltage of the battery 676 or the current flow from the battery 676. The battery parameters may be used to determine actions that the Edge computing node 650 may perform, such as transmission frequency, mesh network operation, sensing frequency, and the like.

A power block 680, or other power supply coupled to a grid, may be coupled with the battery monitor/charger 678 to charge the battery 676. In some examples, the power block 680 may be replaced with a wireless power receiver to obtain the power wirelessly, for example, through a loop antenna in the Edge computing node 650. A wireless battery charging circuit, such as an LTC4020 chip from Linear Technologies of Milpitas, California, among others, may be included in the battery monitor/charger 678. The specific charging circuits may be selected based on the size of the battery 676, and thus, the current required. The charging may be performed using the Airfuel standard promulgated by the Airfuel Alliance, the Qi wireless charging standard promulgated by the Wireless Power Consortium, or the Rezence charging standard, promulgated by the Alliance for Wireless Power, among others.

The storage 658 may include instructions 682 in the form of software, firmware, or hardware commands to implement the techniques described herein. Although such instructions 682 are shown as code blocks included in the memory 654 and the storage 658, it may be understood that any of the code blocks may be replaced with hardwired circuits, for example, built into an application specific integrated circuit (ASIC).

In an example, the instructions 682 provided via the memory 654, the storage 658, or the processor 652 may be embodied as a non-transitory, machine-readable medium 660 including code to direct the processor 652 to perform electronic operations in the Edge computing node 650. The processor 652 may access the non-transitory, machine-readable medium 660 over the interconnect 656. For instance, the non-transitory, machine-readable medium 660 may be embodied by devices described for the storage 658 or may include specific storage units such as storage devices or storage disks that include optical disks (e.g., digital versatile disk (DVD), compact disk (CD), CD-ROM, Blu-ray disk), flash drives, floppy disks, hard drives (e.g., SSDs), or any number of other hardware devices in which information is stored for any duration (e.g., for extended time periods, permanently, for brief instances, for temporarily buffering, or caching). The non-transitory, machine-readable medium 660 may include instructions to direct the processor 652 to perform a specific sequence or flow of actions, for example, as described with respect to the flowchart(s) and block diagram(s) of operations and functionality depicted above. As used herein, the terms "machine-readable medium" and "computer-readable medium" are interchangeable. As used herein, the term "non-transitory computer-readable medium" is expressly defined to include any type of computer readable storage device or storage disk and to exclude propagating signals and to exclude transmission media.

Also in a specific example, the instructions 682 on the processor 652 (separately, or in combination with the instructions 682 of the machine readable medium 660) may configure execution or operation of a trusted execution environment (TEE) 690. In an example, the TEE 690 operates as a protected area accessible to the processor 652 for secure execution of instructions and secure access to data. Various implementations of the TEE 690, and an accompanying secure area in the processor 652 or the memory 654 may be provided, for instance, through use of Intel® Software Guard Extensions (SGX) or ARM® TrustZone® hardware security extensions, Intel® Management Engine (ME), or Intel® Converged Security Manageability Engine (CSME). Other aspects of security hardening, hardware roots-of-trust, and trusted or protected operations may be implemented in the device 650 through the TEE 690 and the processor 652.

While the illustrated examples of FIG. 6A and FIG. 6B include example components for a compute node and a compute device, respectively, examples disclosed herein are not limited thereto. As used herein, a "computer" may include some or all of the example components of FIGS. 6A or 6B in different types of computing environments. Example computing environments include Edge compute devices (e.g., Edge computers) in a distributed networking arrangement such that particular ones of participating Edge compute devices are heterogenous or homogeneous devices. As used herein, a "computer" may include a personal computer, a server, user equipment, an accelerator, etc., including any combinations thereof. In some examples, distributed networking or distributed computing includes any number of such Edge compute devices as illustrated in FIGS. 6A or 6B, each of which may include different sub-components, different memory capacities, I/O capabilities, etc. For example, because some implementations of distributed networking or distributed computing are associated with particular desired functionality, examples disclosed herein include different combinations of components illustrated in FIGS. 6A or 6B to satisfy functional objectives of distributed computing tasks. In some examples, the term "compute node" or "computer" only includes the example processor 604, memory 606 and I/O subsystem 608 of FIG. 6A. In some examples, one or more objective functions of a distributed computing task(s) rely on one or more alternate devices/structure located in different parts of an Edge networking environment, such as devices to accommodate data storage (e.g., the example data storage 610), input/output capabilities (e.g., the example peripheral device(s) 614), or network communication capabilities (e.g., the example NIC 620).

In some examples, computers operating in a distributed computing or distributed networking environment (e.g., an Edge network) are structured to accommodate particular objective functionality in a manner that reduces computational waste. For instance, because a computer includes a subset of the components disclosed in FIGS. 6A and 6B, such computers satisfy execution of distributed computing objective functions without including computing structure that would otherwise be unused or underutilized. As such, the term "computer" as used herein includes any combination of structure of FIGS. 6A or 6B that is capable of satisfying or otherwise executing objective functions of distributed computing tasks. In some examples, computers are structured in a manner commensurate to corresponding distributed computing objective functions in a manner that downscales or upscales in connection with dynamic demand. In some examples, different computers are invoked or otherwise instantiated in view of their ability to process one or more tasks of the distributed computing request(s), such that any computer capable of satisfying the tasks proceed with such computing activity.

In the illustrated examples of FIGS. 6A and 6B, compute devices include operating systems. As used herein, an "operating system" is software to control example compute devices, such as the example Edge compute node 600 of FIG. 6A or the example Edge compute node 650 of FIG. 6B. Example operating systems include, but are not limited to consumer-based operating systems (e.g., Microsoft® Windows® 10, Google® Android® OS, Apple® Mac® OS, etc.). Example operating systems also include, but are not limited to industry-focused operating systems, such as real-time operating systems, hypervisors, etc. An example operating system on a first Edge compute node may be the same or different than an example operating system on a second Edge compute node. In some examples, the operating system invokes alternate software to facilitate one or more functions or operations that are not native to the operating system, such as particular communication protocols or interpreters. In some examples, the operating system instantiates various functionalities that are not native to the operating system. In some examples, operating systems include varying degrees of complexity or capabilities. For instance, a first operating system corresponding to a first Edge compute node includes a real-time operating system having particular performance expectations of responsivity to dynamic input conditions, and a second operating system corresponding to a second Edge compute node includes graphical user interface capabilities to facilitate end-user I/O.

Figure 7:
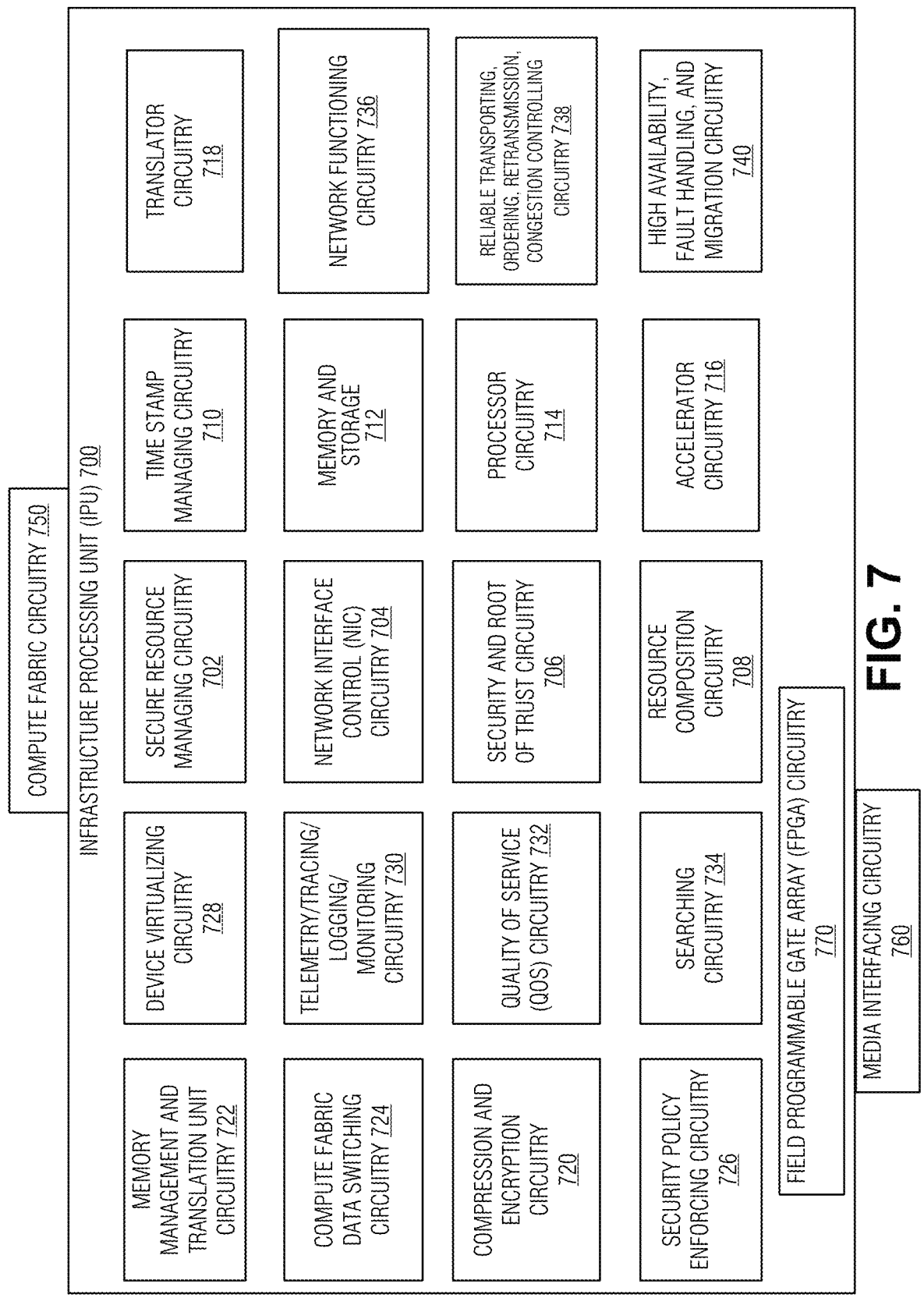
FIG. 7 is a schematic diagram of an example infrastructure processing unit (IPU).

FIG. 7 depicts an example of an infrastructure processing unit (IPU). Different examples of IPUs disclosed herein enable improved performance, management, security and coordination functions between entities (e.g., cloud service providers), and enable infrastructure offload or communications coordination functions. As disclosed in further detail below, IPUs may be integrated with smart NICs and storage or memory (e.g., on a same die, system on chip (SoC), or connected dies) that are located at on-premises systems, base stations, gateways, neighborhood central offices, and so forth. Different examples of one or more IPUs disclosed herein can perform an application including any number of microservices, where each microservice runs in its own process and communicates using protocols (e.g., an HTTP resource API, message service or gRPC). Microservices can be independently deployed using centralized management of these services. A management system may be written in different programming languages and use different data storage technologies.

Furthermore, one or more IPUs can execute platform management, networking stack processing operations, security (crypto) operations, storage software, identity and key management, telemetry, logging, monitoring and service mesh (e.g., control how different microservices communicate with one another). The IPU can access an xPU to offload performance of various tasks. For instance, an IPU exposes XPU, storage, memory, and CPU resources and capabilities as a service that can be accessed by other microservices for function composition. This can improve performance and reduce data movement and latency. An IPU can perform capabilities such as those of a router, load balancer, firewall, TCP/reliable transport, a service mesh (e.g., proxy or API gateway), security, data-transformation, authentication, quality of service (QoS), security, telemetry measurement, event logging, initiating and managing data flows, data placement, or job scheduling of resources on an xPU, storage, memory, or CPU.

In the illustrated example of FIG. 7, the IPU 700 includes or otherwise accesses secure resource managing circuitry 702, network interface controller (NIC) circuitry 704, security and root of trust circuitry 706, resource composition circuitry 708, time stamp managing circuitry 710, memory and storage 712, processing circuitry 714, accelerator circuitry 716, or translator circuitry 718. Any number or combination of other structure(s) can be used such as but not limited to compression and encryption circuitry 720, memory management and translation unit circuitry 722, compute fabric data switching circuitry 724, security policy enforcing circuitry 726, device virtualizing circuitry 728, telemetry, tracing, logging and monitoring circuitry 730, quality of service circuitry 732, searching circuitry 734, network functioning circuitry (e.g., routing, firewall, load balancing, network address translating (NAT), etc.) 736, reliable transporting, ordering, retransmission, congestion controlling circuitry 738, and high availability, fault handling and migration circuitry 740 shown in FIG. 7. Different examples can use one or more structures (components) of the example IPU 700 together or separately. For example, compression and encryption circuitry 720 can be used as a separate service or chained as part of a data flow with vSwitch and packet encryption.

In some examples, IPU 700 includes a field programmable gate array (FPGA) 770 structured to receive commands from an CPU, XPU, or application via an API and perform commands/tasks on behalf of the CPU, including workload management and offload or accelerator operations. The illustrated example of FIG. 7 may include any number of FPGAs configured or otherwise structured to perform any operations of any IPU described herein.

Example compute fabric circuitry 750 provides connectivity to a local host or device (e.g., server or device (e.g., xPU, memory, or storage device)). Connectivity with a local host or device or SmartNIC or another IPU is, in some examples, provided using one or more of peripheral component interconnect express (PCIe), ARM AXI, Intel® QuickPath Interconnect (QPI), Intel® Ultra Path Interconnect (UPI), Intel® On-Chip System Fabric (IOSF), Omnipath, Ethernet, Compute Express Link (CXL), Hyper-Transport, NVLink, Advanced Microcontroller Bus Architecture (AMBA) interconnect, OpenCAPI, Gen-Z, CCIX, Infinity Fabric (IF), and so forth. Different examples of the host connectivity provide symmetric memory and caching to enable equal peering between CPU, XPU, and IPU (e.g., via CXL.cache and CXL.mem).

Example media interfacing circuitry 760 provides connectivity to a remote SmartNIC or another IPU or service via a network medium or fabric. This can be provided over any type of network media (e.g., wired or wireless) and using any protocol (e.g., Ethernet, InfiniBand, Fiber channel, ATM, to name a few).

In some examples, instead of the server/CPU being the primary component managing IPU 700, IPU 700 is a root of a system (e.g., rack of servers or data center) and manages compute resources (e.g., CPU, xPU, storage, memory, other IPUs, and so forth) in the IPU 700 and outside of the IPU 700. Different operations of an IPU are described below.

In some examples, the IPU 700 performs orchestration to decide which hardware or software is to execute a workload based on available resources (e.g., services and devices) and considers service level agreements and latencies, to determine whether resources (e.g., CPU, xPU, storage, memory, etc.) are to be allocated from the local host or from a remote host or pooled resource. In examples when the IPU 700 is selected to perform a workload, secure resource managing circuitry 702 offloads work to a CPU, xPU, or other device and the IPU 700 accelerates connectivity of distributed runtimes, reduce latency, CPU and increases reliability.

In some examples, secure resource managing circuitry 702 runs a service mesh to decide what resource is to execute workload, and provide for L7 (application layer) and remote procedure call (RPC) traffic to bypass kernel altogether so that a user space application can communicate directly with the example IPU 700 (e.g., IPU 700 and application can share a memory space). In some examples, a service mesh is a configurable, low-latency infrastructure layer designed to handle communication among application microservices using application programming interfaces (APIs) (e.g., over remote procedure calls (RPCs)). The example service mesh provides fast, reliable, and secure communication among containerized or virtualized application infrastructure services. The service mesh can provide critical capabilities including, but not limited to service discovery, load balancing, encryption, observability, traceability, authentication and authorization, and support for the circuit breaker pattern.

In some examples, infrastructure services include a composite node created by an IPU at or after a workload from an application is received. In some cases, the composite node includes access to hardware devices, software using APIs, RPCs, gRPCs, or communications protocols with instructions such as, but not limited to iSCSI, NVMe-oF, or CXL.

In some cases, the example IPU 700 dynamically selects itself to run a given workload (e.g., microservice) within a composable infrastructure including an IPU, xPU, CPU, storage, memory, and other devices in a node.

In some examples, communications transit through media interfacing circuitry 760 of the example IPU 700 through a NIC/SmartNIC (for cross node communications) or loopback back to a local service on the same host. Communications through the example media interfacing circuitry 760 of the example IPU 700 to another IPU can then use shared memory support transport between xPUs switched through the local IPUs. Use of IPU-to-IPU communication can reduce latency and jitter through ingress scheduling of messages and work processing based on service level objective (SLO).

For example, for a request to a database application that requires a response, the example IPU 700 prioritizes its processing to minimize the stalling of the requesting application. In some examples, the IPU 700 schedules the prioritized message request issuing the event to execute a SQL query database and the example IPU constructs microservices that issue SQL queries and the queries are sent to the appropriate devices or services.

Figure 8:
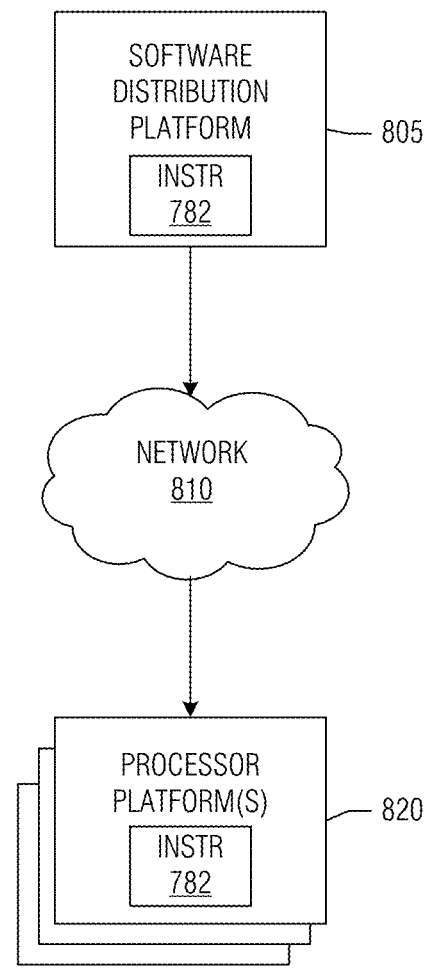
FIG. 8 illustrates an example software distribution platform to distribute software

FIG. 8 illustrates an example software distribution platform 805 to distribute software, such as the example computer readable instructions 682 of FIG. 6, to one or more devices, such as example processor platform(s) 800 or connected edge devices. The example software distribution platform 805 may be implemented by any computer server, data facility, cloud service, etc., capable of storing and transmitting software to other compute devices (e.g., third parties). Example connected Edge devices may be customers, clients, managing devices (e.g., servers), third parties (e.g., customers of an entity owning or operating the software distribution platform 805). Example connected Edge devices may operate in commercial or home automation environments. In some examples, a third party is a developer, a seller, or a licensor of software such as the example computer readable instructions 682 of FIG. 6. The third parties may be consumers, users, retailers, OEMs, etc., that purchase or license the software for use or re-sale or sub-licensing. In some examples, distributed software causes display of one or more user interfaces (UIs) or graphical user interfaces (GUIs) to identify the one or more devices (e.g., connected Edge devices) geographically or logically separated from each other (e.g., physically separated IoT devices chartered with the responsibility of water distribution control (e.g., pumps), electricity distribution control (e.g., relays), etc.).

In the illustrated example of FIG. 8, the software distribution platform 805 includes one or more servers and one or more storage devices. The storage devices store the computer readable instructions 682, which may correspond to the example computer readable instructions described herein. The one or more servers of the example software distribution platform 805 are in communication with a network 810, which may correspond to any one or more of the Internet or any of the example networks described herein. In some examples, the one or more servers are responsive to requests to transmit the software to a requesting party as part of a commercial transaction. Payment for the delivery, sale, or license of the software may be handled by the one or more servers of the software distribution platform or via a third-party payment entity. The servers enable purchasers or licensors to download the computer readable instructions 682 from the software distribution platform 805. For example, the software, which may correspond to the example computer readable instructions discussed elsewhere herein, may be downloaded to the example processor platform(s) 820 (e.g., example connected Edge devices), which are to execute the computer readable instructions 682 to implement techniques described herein. In some examples, one or more servers of the software distribution platform 805 are communicatively connected to one or more security domains or security devices through which requests and transmissions of the example computer readable instructions 682 must pass. In some examples, one or more servers of the software distribution platform 805 periodically offer, transmit, or force updates to the software (e.g., the example computer readable instructions 682 of FIG. 6) to ensure improvements, patches, updates, etc., are distributed and applied to the software at the end user devices.

In the illustrated example of FIG. 8, the computer readable instructions 682 are stored on storage devices of the software distribution platform 805 in a particular format. A format of computer readable instructions includes, but is not limited to a particular code language (e.g., Java, JavaScript, Python, C, C #, SQL, HTML, etc.), or a particular code state (e.g., uncompiled code (e.g., ASCII), interpreted code, linked code, executable code (e.g., a binary), etc.). In some examples, the computer readable instructions 682 stored in the software distribution platform 805 are in a first format when transmitted to the example processor platform(s) 820. In some examples, the first format is an executable binary in which particular types of the processor platform(s) 820 can execute. However, in some examples, the first format is uncompiled code that requires one or more preparation tasks to transform the first format to a second format to enable execution on the example processor platform(s) 820. For instance, the receiving processor platform(s) 820 may need to compile the computer readable instructions 682 in the first format to generate executable code in a second format that is capable of being executed on the processor platform(s) 820. In still other examples, the first format is interpreted code that, upon reaching the processor platform(s) 820, is interpreted by an interpreter to facilitate execution of instructions.

Figure 9:
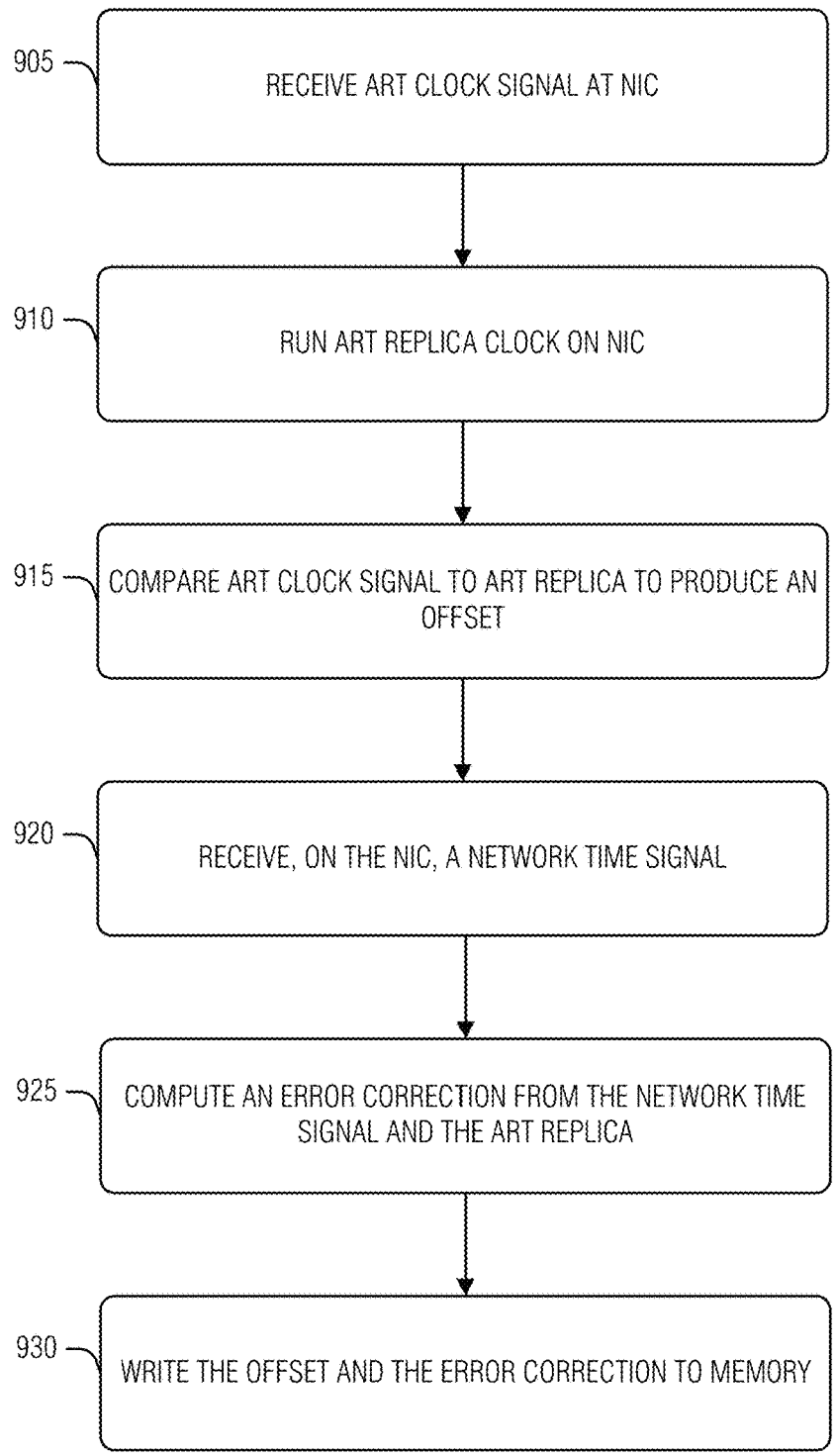
FIG. 9 illustrates a flow diagram of an example of a method for synchronizing a real-time clock and a network clock, according to an embodiment.

FIG. 9 illustrates a flow diagram of an example of a method 900 for synchronizing a real-time clock and a network clock, according to an embodiment. The operations of the method 900 are performed by computer hardware, such as that described above or below (e.g., processing circuitry).

At operation 905, a signal from an always-running timer (ART) for a compute device is received at a network interface for the compute device. In an example, the ART is included in a power management component (PMC) of the compute device.

At operation 910, an ART replica is run inside the network interface.

At operation 915, the ART signal is compared to output of the ART replica to produce an offset.

At operation 920, a network time from a network node is received at the network interface.

At operation 925, the network interface computes an error correction from the network time and the output of the ART replica. In an example, computing the error correction includes using a proportional integration control loop. In an example, the error correction includes an error accumulation. In an example, the error correction includes a multiplier.

In an example, computing the error correction includes sampling the network time and the ART replica output continually at a frequency. Here, the network time is received continually. the error correction may then be computed after each sampling of the network time. In an example, the frequency is greater than ten megahertz.

At operation 930, the network interface writes the offset and the error correction to working memory of the compute device.

In an example, the operations of the method 900 include reading the offset and the error correction from the working memory, obtaining a central processing unit (CPU) time based on the ART, and determining a system time for the compute device by applying the offset and the error correction to the CPU time. In an example, reading the offset and the error, and obtaining the CPU time, are performed by invoking a single CPU instruction.

Figure 10:
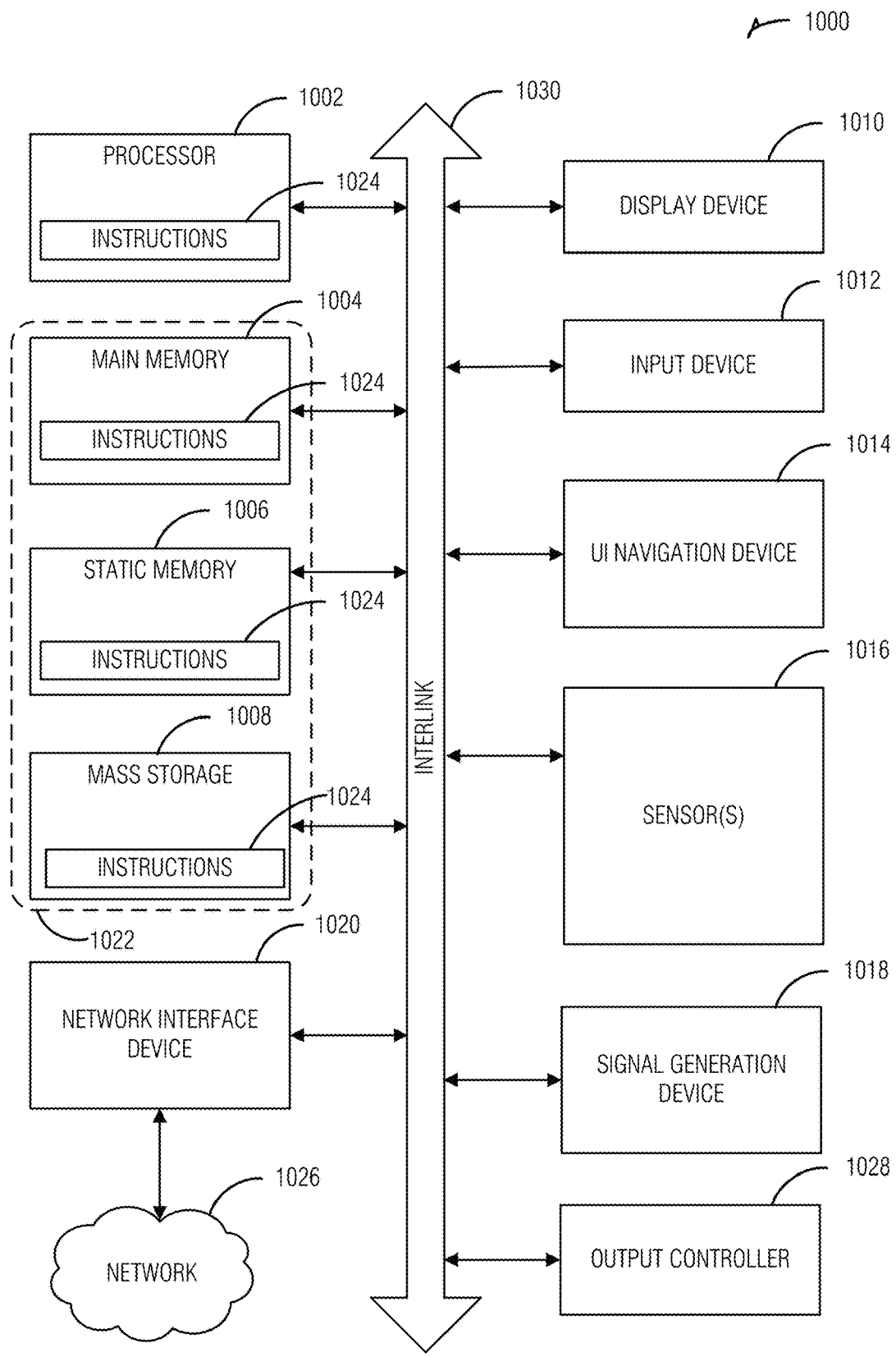
FIG. 10 is a block diagram illustrating an example of a machine upon which one or more embodiments may be implemented.

FIG. 10 illustrates a block diagram of an example machine 1000 upon which any one or more of the techniques (e.g., methodologies) discussed herein may perform. Examples, as described herein, may include, or may operate by, logic or a number of components, or mechanisms in the machine 1000. Circuitry (e.g., processing circuitry) is a collection of circuits implemented in tangible entities of the machine 1000 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 1000 follow.

In alternative embodiments, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 1000 may include a hardware processor 1002 (e.g., a central processing unit (CPU), a graphics processing unit (GPU), a hardware processor core, or any combination thereof), a main memory

1004, a static memory (e.g., memory or storage for firmware, microcode, a basic-input-output (BIOS), unified extensible firmware interface (UEFI), etc.) 1006, and mass storage 1008 (e.g., hard drives, tape drives, flash storage, or other block devices) some or all of which may communicate with each other via an interlink (e.g., bus) 1030. The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a storage device (e.g., drive unit) 1008, a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 1002, the main memory 1004, the static memory 1006, or the mass storage 1008 may be, or include, a machine readable medium 1022 on which is stored one or more sets of data structures or instructions 1024 (e.g., software) embodying or utilized by any one or more of the techniques or functions described herein. The instructions 1024 may also reside, completely or at least partially, within any of registers of the processor 1002, the main memory 1004, the static memory 1006, or the mass storage 1008 during execution thereof by the machine 1000. In an example, one or any combination of the hardware processor 1002, the main memory 1004, the static memory 1006, or the mass storage 1008 may constitute the machine readable media 1022. While the machine readable medium 1022 is illustrated as a single medium, the term "machine readable medium" may include a single medium or multiple media (e.g., a centralized or distributed database, or associated caches and servers) configured to store the one or more instructions 1024.

The term "machine readable medium" may include any medium that is capable of storing, encoding, or carrying instructions for execution by the machine 1000 and that cause the machine 1000 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 1022 may be representative of the instructions 1024, such as instructions 1024 themselves or a format from which the instructions 1024 may be derived. This format from which the instructions 1024 may be derived may include source code, encoded instructions (e.g., in compressed or encrypted form), packaged instructions (e.g., split into multiple packages), or the like. The information representative of the instructions 1024 in the machine readable medium 1022 may be processed by processing circuitry into the instructions to implement any of the operations discussed herein. For example, deriving the instructions 1024 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1024.

In an example, the derivation of the instructions 1024 may include assembly, compilation, or interpretation of the information (e.g., by the processing circuitry) to create the instructions 1024 from some intermediate or preprocessed format provided by the machine readable medium 1022. The information, when provided in multiple parts, may be combined, unpacked, and modified to create the instructions 1024. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1024 may be further transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3 G, 4 G LTE/LTE-A, or 5 G standards), Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1000, and includes digital or analog communications signals or other intangible medium to facilitate communication of such software. A transmission medium is a machine readable medium.

Additional Notes & Examples

Example 1 is a network interface device for synchronizing a real-time clock and a network clock, the network interface device comprising: an input line configured to receive an always-running timer (ART) clock signal from an ART for a compute device that includes, the network interface; an ART replica configured to produce an ART replica clock signal; network time circuitry configured to receive a network time from a network node; error correction circuitry configured to: compare the ART clock signal to the ART replica clock signal to produce an offset; compute an error correction from the network time and the output of the ART replica; and write the offset and the error correction to working memory of the compute device.

In Example 2, the subject matter of Example 1 includes, wherein the error correction circuitry includes a proportional integration control loop, and wherein, to compute the error correction, the error correction circuitry is configured to use the proportional integration control loop.

In Example 3, the subject matter of Example 2 includes, wherein the error correction includes an error accumulation.

In Example 4, the subject matter of Examples 2-3 includes, wherein the error correction includes a multiplier.

In Example 5, the subject matter of Examples 1-4 includes, wherein the compute node includes a processor configured to: read the offset and the error correction from the working memory; obtain a central processing unit (CPU) time based on the ART; and determine a system time for the compute device by applying the offset and the error correction to the CPU time.

In Example 6, the subject matter of Example 5 includes, wherein the processor is invoked to read the offset and the error, and obtain the CPU time by a single CPU instruction.

In Example 7, the subject matter of Examples 1-6 includes, wherein the ART is included in a power management component (PMC) of the compute device.

In Example 8, the subject matter of Examples 1-7 includes, wherein, to compute the error correction, the error correction circuitry is configured to: sample the network time and the ART replica clock signal continually at a frequency, wherein the network time is received continually; and compute the error correction after each sampling of the network time.

In Example 9, the subject matter of Example 8 includes, wherein the frequency is greater than ten megahertz.

Example 10 is a method for synchronizing a real-time clock and a network clock, the method comprising: receiving, in a network interface, a signal from an always-running timer (ART) for a compute device; running, in the network interface, an ART replica; comparing the ART signal to output of the ART replica to produce an offset; receiving, at the network interface, a network time from a network node; computing, by the network interface, an error correction from the network time and the output of the ART replica; and writing, by the network interface, the offset and the error correction to working memory of the compute device.

In Example 11, the subject matter of Example 10 includes, wherein computing the error correction includes using a proportional integration control loop.

In Example 12, the subject matter of Example 11 includes, wherein the error correction includes an error accumulation.

In Example 13, the subject matter of Examples 11-12 includes, wherein the error correction includes a multiplier.

In Example 14, the subject matter of Examples 10-13 includes, reading the offset and the error correction from the working memory; obtaining a central processing unit (CPU) time based on the ART; and determining a system time for the compute device by applying the offset and the error correction to the CPU time.

In Example 15, the subject matter of Example 14 includes, wherein reading the offset and the error, and obtaining the CPU time, are performed by invoking a single CPU instruction.

In Example 16, the subject matter of Examples 10-15 includes, wherein the ART is included in a power management component (PMC) of the compute device.

In Example 17, the subject matter of Examples 10-16 includes, wherein computing the error correction includes: sampling the network time and the ART replica output continually at a frequency, wherein the network time is received continually; and computing the error correction after each sampling of the network time.

In Example 18, the subject matter of Example 17 includes, wherein the frequency is greater than ten megahertz.

Example 19 is a system for synchronizing a real-time clock and a network clock, the system comprising: means for receiving, in a network interface, a signal from an always-running timer (ART) for a compute device; means for running, in the network interface, an ART replica; means for comparing the ART signal to output of the ART replica to produce an offset; means for receiving, at the network interface, a network time from a network node; means for computing, by the network interface, an error correction from the network time and the output of the ART replica; and means for writing, by the network interface, the offset and the error correction to working memory of the compute device.

In Example 20, the subject matter of Example 19 includes, wherein the means for computing the error correction include means for using a proportional integration control loop.

In Example 21, the subject matter of Example 20 includes, wherein the error correction includes an error accumulation.

In Example 22, the subject matter of Examples 20-21 includes, wherein the error correction includes a multiplier.

In Example 23, the subject matter of Examples 19-22 includes, means for reading the offset and the error correction from the working memory; means for obtaining a central processing unit (CPU) time based on the ART; and means for determining a system time for the compute device by applying the offset and the error correction to the CPU time.

In Example 24, the subject matter of Example 23 includes, wherein the means for reading the offset and the error, and the means for obtaining the CPU time, are performed by invoking a single CPU instruction.

In Example 25, the subject matter of Examples 19-24 includes, wherein the ART is included in a power management component (PMC) of the compute device.

In Example 26, the subject matter of Examples 19-25 includes, wherein the means for computing the error correction includes: means for sampling the network time and the ART replica output continually at a frequency, wherein the network time is received continually; and means for computing the error correction after each sampling of the network time.

In Example 27, the subject matter of Example 26 includes, wherein the frequency is greater than ten megahertz.

Example 28 is at least one machine-readable medium including instructions that, when executed by processing circuitry, cause the processing circuitry to perform operations to implement of any of Examples 1-27.

Example 29 is an apparatus comprising means to implement of any of Examples 1-27.

Example 30 is a system to implement of any of Examples 1-27.

Example 31 is a method to implement of any of Examples 1-27.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

The invention claimed is:

1. A network interface device for synchronizing a real-time clock and a network clock, the network interface device comprising:
    an input line configured to receive an always-running timer (ART) clock signal from an ART for a compute device that includes the network interface;
    an ART replica configured to produce an ART replica clock signal;
    network time circuitry configured to receive a network time from a network node;
    error correction circuitry configured to:
        compare the ART clock signal to the ART replica clock signal to produce an offset;
        compute an error correction from the network time and the output of the ART replica; and
        write the offset and the error correction to working memory of the compute device.

2. The network interface device of claim 1, wherein the error correction circuitry includes a proportional integration control loop, and wherein, to compute the error correction, the error correction circuitry is configured to use the proportional integration control loop.

3. The network interface device of claim 2, wherein error correction includes an error accumulation.

4. The network interface device of claim 2, wherein the error correction includes a multiplier.

5. The network interface device of claim 1, wherein the compute node includes a processor configured to:
    read the offset and the error correction from the working memory;
    obtain a central processing unit (CPU) time based on the ART; and
    determine a system time for the compute device by applying the offset and the error correction to the CPU time.

6. The network interface device of claim 5, wherein the processor is invoked to read the offset and the error, and obtain the CPU time by a single CPU instruction.

7. The network interface device of claim 1, wherein the ART is included in a power management component (PMC) of the compute device.

8. The network interface device of claim 1, wherein, to compute the error correction, the error correction circuitry is configured to:
    sample the network time and the ART replica clock signal continually at a frequency, wherein the network time is received continually; and
    compute the error correction after each sampling of the network time.

9. The network interface device of claim 8, wherein the frequency is greater than ten megahertz.

10. A network appliance for synchronizing a real-time clock and a network clock, the network appliance comprising:
    memory including instructions; and
    processing circuitry that, when configured by the instructions, performs operations comprising:
        receiving a signal from an always-running timer (ART) for a compute device in which the appliance is located;
        running an ART replica;
        comparing the ART signal to output of the ART replica to produce an offset;
        receiving a network time from a network node external to the compute device;

computing an error correction from the network time and the output of the ART replica; and writing the offset and the error correction to working memory of the compute device.

11. The network appliance of claim 10, wherein computing the error correction includes using a proportional integration control loop.

12. The network appliance of claim 11, wherein the error correction includes an error accumulation.

13. The network appliance of claim 11, wherein the error correction includes a multiplier.

14. The network appliance of claim 10, wherein an operating system of the compute device generates a system time by:

reading the offset and the error correction from the working memory;

obtaining a central processing unit (CPU) time based on the ART; and determining the system time for the compute device by applying the offset and the error correction to the CPU time.

15. The network appliance of claim 14, wherein a single CPU instruction is used to read the offset and the error, and to obtain the CPU time.

16. The network appliance of claim 10, wherein the ART is included in a power management component (PMC) of the compute device.

17. The network appliance of claim 10, wherein computing the error correction includes:

sampling the network time and the ART replica output continually at a frequency, wherein the network time is received continually; and computing the error correction after each sampling of the network time.

18. The network appliance of claim 17, wherein the frequency is greater than ten megahertz.

19. A system for synchronizing a real-time clock and a network clock, the system comprising:

means for receiving, in a network interface, a signal from an always-running timer (ART) for a compute device;

means for running, in the network interface, an ART replica;

means for comparing the ART signal to output of the ART replica to produce an offset;

means for receiving, at the network interface, a network time from a network node;

means for computing, by the network interface, an error correction from the network time and the output of the ART replica; and means for writing, by the network interface, the offset and the error correction to working memory of the compute device.

20. The system of claim 19, wherein the means for computing the error correction include means for using a proportional integration control loop.

21. The system of claim 20, wherein the error correction includes an error accumulation.

22. The system of claim 20, wherein the error correction includes a multiplier.

23. The system of claim 19, wherein the means for computing the error correction includes:

means for sampling the network time and the ART replica output continually at a frequency, wherein the network time is received continually; and means for computing the error correction after each sampling of the network time.

24. The system of claim 23, wherein the frequency is greater than ten megahertz.

* * * * *